US012178131B1

(12) United States Patent
Salah et al.

(10) Patent No.: US 12,178,131 B1
(45) Date of Patent: Dec. 24, 2024

(54) OIL FLY ASH AND CARBON NANOTUBE THERMOELECTRIC NANOCOMPOSITE

(71) Applicant: King Abdulaziz University, Jeddah (SA)

(72) Inventors: Numan Salah, Jeddah (SA); Shittu Abdullahi, Jeddah (SA); Ahmed Alshahrei, Jeddah (SA); Kunihito Koumoto, Nagoya (JP)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 18/649,277

(22) Filed: Apr. 29, 2024

(51) Int. Cl.
  *H10N 10/855* (2023.01)
  *H10N 10/01* (2023.01)
  *H10N 10/856* (2023.01)

(52) U.S. Cl.
  CPC ........... *H10N 10/855* (2023.02); *H10N 10/01* (2023.02); *H10N 10/856* (2023.02)

(58) Field of Classification Search
  CPC ..... H10N 10/01; H10N 10/855; H10N 10/856
  See application file for complete search history.

(56) References Cited

U.S. PATENT DOCUMENTS

| | | | |
|---|---|---|---|
| 8,277,691 | B2 | 10/2012 | Lu |
| 8,580,431 | B2 | 11/2013 | Roev et al. |
| 2016/0297952 | A1 | 10/2016 | Chen et al. |
| 2017/0058096 | A1 | 3/2017 | Salah et al. |

FOREIGN PATENT DOCUMENTS

| | | | |
|---|---|---|---|
| CN | 104945659 A | | 9/2015 |
| KR | 2020-0021807 | * | 3/2020 |
| WO | WO 2015/008727 | * | 1/2015 |

OTHER PUBLICATIONS

Kalakonda et al.—"Thermomechanical properties of PMMA and modified SWONT composites", Nanotechnology, Science and Applications 2017:10, pp. 45-52.
Kathalingam et al.—"Characterization and application of flexible, highly conductive freestanding films of SWONT and PMMA nanocomposite prepared by facile solution method", Surfaces and Interfaces, vol. 40, Aug. 2023, 103161.

* cited by examiner

*Primary Examiner* — C Melissa Koslow
(74) *Attorney, Agent, or Firm* — Oblon, McClelland, Maier & Neustadt, L.L.P.

(57) ABSTRACT

A thermoelectric nanocomposite including porous carbonaceous particles, electrically conductive carbon nanotubes, and a binder. The porous carbonaceous particles contain 88.5 to 96.45 wt % carbon, 1.0 to 3.0 wt % oxygen, 2.5 to 7.5 wt % sulfur, and 0.05 to 1.0 wt % vanadium. The thermoelectric nanocomposite has a thermoelectric figure of merit ZT of 0.018 to 0.026 at 293 K and 0.016 to 0.024 at 393 K, a power factor of 10 to 14.0 $\mu w/mK^2$ at 233 K and greater than 14.0 to 18 $\mu W/mK^2$ at 393 K, and a Seebeck value of 24 to 27 $\mu V/K$ at 233 K and 30 to 34 $\mu V/K$ at 393 K. The thermoelectric nanocomposite may include milled, acid-treated oil fly ash. Also, a method of forming the thermoelectric nanocomposite. The thermoelectric nanocomposite may be used in a thermoelectric device.

20 Claims, 15 Drawing Sheets

OIL FLY ASH AND CARBON NANOTUBE THERMOELECTRIC NANOCOMPOSITE

BACKGROUND OF THE INVENTION

Field of the Invention

The present disclosure relates to a nanocomposite material that includes treated oil fly ash and carbon nanotubes preferably for use in a thermoelectric device.

Discussion of the Background

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

Global energy demand has risen dramatically in recent years, in part due to increases in human population and the ubiquity of electrical devices and systems in every part of life. This has resulted in an energy crisis, drastic environmental pollution, and unpredictable climate change. Energy from fossil fuels such as oil and coal remains non-sustainable owing to the limited, rapidly-exhausting supplies and the negative environmental impact associated with these fuels. The necessity for ecofriendly and sustainable alternate energy sources is extremely high. Renewable energy is collected from natural sources that are replenished at a higher rate than they are consumed. Sun light and heat are examples of these resources. It is of great importance to establish efficient technologies for harvesting energy from these sustainable sources.

One of the most promising technologies to harvest renewable energy is converting waste heat into electrical energy using effective thermoelectric (TE) materials. Harvesting considerable energy from the heat generated by the sun or from any other source like the heat emitted by combustion engines and machines/devices is possible using promising TE materials. Moreover, the global thermoelectric materials market is increasing because of the high demand of TE devices in industry, automotive, healthcare, and electronics applications. However, the use of thermoelectric (TE) devices that can directly convert waste heat into electricity has been hampered by the lack of inexpensive, scalable and highly efficient materials. Efficient utilization of the temperature gradient heavily depends on materials that can provide high power factor and low lattice thermal conductivity. At a particular temperature (T), the efficiency of a TE device is measured by the dimensionless figure of merit, $$zT\left(zT = \frac{S^2\sigma}{\kappa}\right)$$

given by the Seebeck coefficient (S), electrical conductivity ($\sigma$) and thermal conductivity (k), which is sum of electronic and lattice contributions [M. Sajjad, et. al., ACS Appl. Energy Mater, 2019, 25, 3004; and N. Salah, et. al., Journal of the European Ceramic Society, 2019, 39, 3307].

The development of highly efficient TE materials that fulfil all the requirements and exhibit high electrical conductivity, large Seebeck coefficient, and low thermal conductivity is an active area of research. In the last 7-8 decades many materials and structures have been developed and investigated for their TE efficiency. The first developed TE material was $Bi_2Te_3$ [Heikes, R. R. et. al., Thermoelectricity: Science and engineering, Interscience Publ., New York & London, 1961]. Then this was followed by n-type $Bi_2Te_{3-x}Se_x$ and p-type $Bi_{2-x}Sb_xTe_3$ TE materials [Snyder, G. J.; Toberer, E. S., Nature Mater, 2008, 7, 105-114.]. Subsequently a wide variety of TE materials, such as sulfides, selenides, silicides, skutterudites, intermetallic compounds, oxides, organic polymers, carbon nanomaterials. etc. have been produced [Zhang, Y., et. al., Mater. Today Energy, 2022, 25, 100958; Li, L., et. al., Ceram. Int., 2015, 41, 409-415; Zhang, W., et. al., Ceram. Int., 2018, 44, 17251-17257; Ahmad, A., et. al., ACS Appl. Energy Mater., 2020, 3, 1552-1558; Stevens, D. L., et. al., ACS Appl. Energy Mater., 2019, 2, 5975-5982; Almasoudi, M., et. al., Polymer, 2021, 228, 123950, Chakraborty, P., et. al., Adv. Cond. Matter Phys., 2018, 2018, ID 3898479; Baghdadi, N., et. al., Polymers, 2021, 13, 278; and Famengo, A., et. al., Polymer Int., 2017, 66, 1725-1730]. Some of these TE materials have attractive properties related to their performance, however, the scalability, cost, toxicity, stability, and brittleness are still major issues that preclude their use.

Organic materials and conducting polymers have attracted increasing attention for applications as thermoelectric materials. This is mainly due to their light weight, flexibility, abundant raw materials, low cost and low thermal conductivity. They were rapidly developed mainly in recent years as a result of their several advantages over inorganic thermoelectric materials. The conducting polymers have attractive features like their lightweight, less expensive, easy fabrication process, reasonable thermal conductivity, and excellent flexibility. Moreover, they can be easily blended with different carbon nanomaterials. For instance, the TE performance and power generation of different organic polymers can be significantly enhanced by controlling the combination of graphene nanosheets or carbon nanotubes (CNTs) with such polymers [Gao, C.; Chen, G., Compos. Sci. Technol., 2016, 124, 52-70; Glaudell, A. M., et. al., Adv. Energy Mater., 2015, 5, 1401072; Krause, B., et. al., Nanomaterials, 2021, 11, 1146]. The most well-known conducting polymers that have been studied as TE materials are poly (3,4-ethylene dioxythiophene) (PEDOT) [Tonga, M., et. al., Int. J. Energ. Res., 2020, 44, 9149-9156; Jiang, Q., et. al., J. Polym. Sci. B Polym. Phys., 2014, 52, 737-742; and Xu, K., et. al., Org. Electron., 2016, 31, 41-47], polyaniline (PANI) [Liu, S., et. al., CCS Chem., 2021, 3, 2547-2560], and polypyrrole (PPy) [Li, C., et. al., Appl. Therm. Eng., 2017, 111, 1441-1447]. However, the TE performance was still relatively low in addition to their relatively high cost and the long-time of processing and fabrication. The added carbon nanomaterials into these polymers have mostly low electrical conductivity. The low interaction between the conducting polymer and the carbon material is also a problematic issue limiting performance [Liang, L., et. al., Mater. Chem. Front., 2017, 1, 380-386; and Liang, L., et. al., Compos. Sci. Technol., 2016, 129, 130-136]. Controlling/tuning the morphology and dimensions of these polymers was also investigated [Zhang, Z., et. al., Chem. Asian J., 2015, 10, 149-153; and Zhang, Z., et. al., J. Mater. Chem. C., 2015, 3, 1649-1654].1 However, no significant improvement in the TE performance that can lead to the real applications was described.

Carbon nanotubes (CNT) have attractive properties mainly their high electrical conductivity, but most of the commercial CNTs have relatively small Seebeck coefficient. For single walls CNT (SWCNT) the Seebeck value is mostly within the range 11-88 µV/K [J. L. Blackburn, et. al., Adv. Mater., 2018, 30, 1704386]. They have better electrical conductivity sometimes close to a sememetallic materials [Shinsuke Ishihara, et. al., ACS Applied Materials & Interfaces, 2017, 9, 38062-38067; and Igor A. Tambasov, et. al., Physica E: Low-dimensional Systems and Nanostructures, 2019, 114, 113619.] Recently the cost of SWCNT has been significantly reduced.

Oil fly ash (OFA) is a byproduct black powder generated by the burning of heavy or crude oil in factories, power and desalination plants [Numan Salah, et. al., Methods, 2022, 199, 37-53, incorporated herein by reference in its entirety]. A huge amount of OFA is produced annually worldwide and is mostly treated as a solid waste with no use or recycling. Hundreds of thousands of tons are produced every year. For example, the Kingdom of Saudi Arabia alone produces about 500,000 tons a year. The OFA has oxides similar to those of coal fly ash, but in lower concentrations. It contains more than 80-90 wt % unburned carbon in graphitic and amorphous forms. The micron-sized particles of OFA have morphology, density, and color different than those of the coal fly ash. There are some efforts to utilize and recycle the OFA and reduce its environmental effects [S. M. Allugmani, et. al., Ceram. Int., 2021, 47, 13544-13551; Jian Yin, et. al., ACS Appl. Mater. Interfaces, 2021, 13, 26421-264301; and Salah, N., et. al. Carbon Lett., 2016, 19, 23-31]. The successful utilization of OFA, which have proved to have attractive structural properties is quite important for economic and sustainable development. Recently, OFA has been reported to be a suitable catalyst and co-precursor for carbon nanotube (CNTs) production [Salah, N., et. al., Mater. Manuf. Processes, 2016, 31, 146-156].

As such, it is an objective of this disclosure to provide a nanocomposite material that includes oil fly ash that is useful as a thermoelectric material.

SUMMARY OF THE INVENTION

The present disclosure relates to a thermoelectric nanocomposite, comprising porous carbonaceous particles, electrically conductive carbon nanotubes, and a binder, wherein the porous carbonaceous particles comprise 88.5 to 96.45 wt % carbon, 1.0 to 3.0 wt % oxygen, 2.5 to 7.5 wt % sulfur, and 0.05 to 1.0 wt % vanadium, and the thermoelectric nanocomposite has a thermoelectric figure of merit ZT of 0.018 to 0.026 at 293 K and 0.016 to 0.024 at 393 K, a power factor of 10 to 14.0 µw/mK$^2$ at 233 K and greater than 14.0 to 18 µW/mK$^2$ at 393 K, and a Seebeck value of 24 to 27 µV/K at 233 K and 30 to 34 µV/K at 393 K.

In some embodiments, the thermoelectric nanocomposite comprises 80 to 95 wt % porous carbonaceous particles, 1 to 10 wt % electrically conductive carbon nanotubes, and 2.5 to 12.5 wt % a binder, each based on a total weight of thermoelectric nanocomposite.

In some embodiments, the porous carbonaceous particles are substantially spherical and have a mean particle size of 5 to 100 nm.

In some embodiments, the porous carbonaceous particles are substantially free of iron by EDS.

In some embodiments, the electrically conductive carbon nanotubes are single-walled carbon nanotubes.

In some embodiments, the electrically conductive carbon nanotubes have an electrical conductivity in compact pellet form of 80,000 to 95,000 S/m at 233 K and 59,000 to 76,000 S/m at 393 K.

In some embodiments, the electrically conductive carbon nanotubes have a mean diameter of 0.25 to 10 nm.

In some embodiments, the binder is polymethyl methacrylate.

In some embodiments, the thermoelectric nanocomposite has a density of 0.50 to 0.60 g/cm$^3$.

In some embodiments, the thermoelectric nanocomposite has an electrical conductivity of 18,250 to 21,000 S/m at 233 K and 16,500 to less than 18,250 S/m at 393 K.

In some embodiments, the thermoelectric nanocomposite has a thermal conductivity of 0.150 to 0.200 w/mK at 293 K and 0.300 to 0.350 W/mK at 393 K.

In some embodiments, the thermoelectric nanocomposite has a specific heat of 0.325 to 0.400 J/gK at 293 K and a specific heat of 0.395 to 0.450 J/gK at 393 K.

In some embodiments, the thermoelectric nanocomposite has a carrier density of $0.5 \times 10^{19}$ to $2.0 \times 10^{19}$ cm$^{-1}$ at 233 K and $4.0 \times 10^{19}$ to $7.5 \times 10^{19}$ cm$^{-1}$ at 393 K.

The present disclosure also relates to a method of forming the thermoelectric nanocomposite, the method comprising dispersing the porous carbonaceous particles and the electrically conducive carbon nanotubes in a first solvent to form a carbonaceous suspension, dissolving the binder in a second solvent to form a binder solution, mixing the carbonaceous suspension and the binder solution at room temperature to form a mixture, casting the mixture in a mold to form an intermediate product, and annealing the intermediate product at 75 to 150° C. to form the thermoelectric nanocomposite.

In some embodiments, the method further comprises forming the porous carbonaceous particles by milling oil fly ash to produce a milled ash, treating the milled ash with an acid mixture to form a treated ash, and drying the treated ash to form the porous carbonaceous particles.

In some embodiments, the milling is high-energy ball milling and is performed for 12 to 48 h.

In some embodiments, the acid mixture comprises sulfuric acid and nitric acid.

In some embodiments, the acid mixture has a mole ratio of sulfuric acid to nitric acid of 1:1 to 5:1.

In some embodiments, the first solvent and the second solvent are chloroform.

The present disclosure also relates to a thermoelectric device, comprising a first electrode, a second electrode, and the thermoelectric nanocomposite, wherein the first electrode and second electrode are separated by the thermoelectric nanocomposite.

BRIEF DESCRIPTION OF THE DRAWINGS

FIGS. 3A-3B show SEM images of at low magnification (FIG. 3A) and high magnification (FIG. 3B), FIG. 3C shows the Raman spectrum, and FIG. 3D shows the XPS spectrum of the deconvoluted C1s band.

FIG. 6A shows electrical conductivity, FIG. 6B shows Seebeck coefficient, and FIG. 6C shows power factor.

FIG. 7A shows electrical conductivity, FIG. 7B shows Seebeck coefficient, and FIG. 7C shows power factor.

FIG. 10A shows the voltage as a function of the current, FIG. 10B shows the power as a function of the current, and FIG. 10C shows the power as a function of the resistance.

DETAILED DESCRIPTION OF THE INVENTION

Figure 1A:
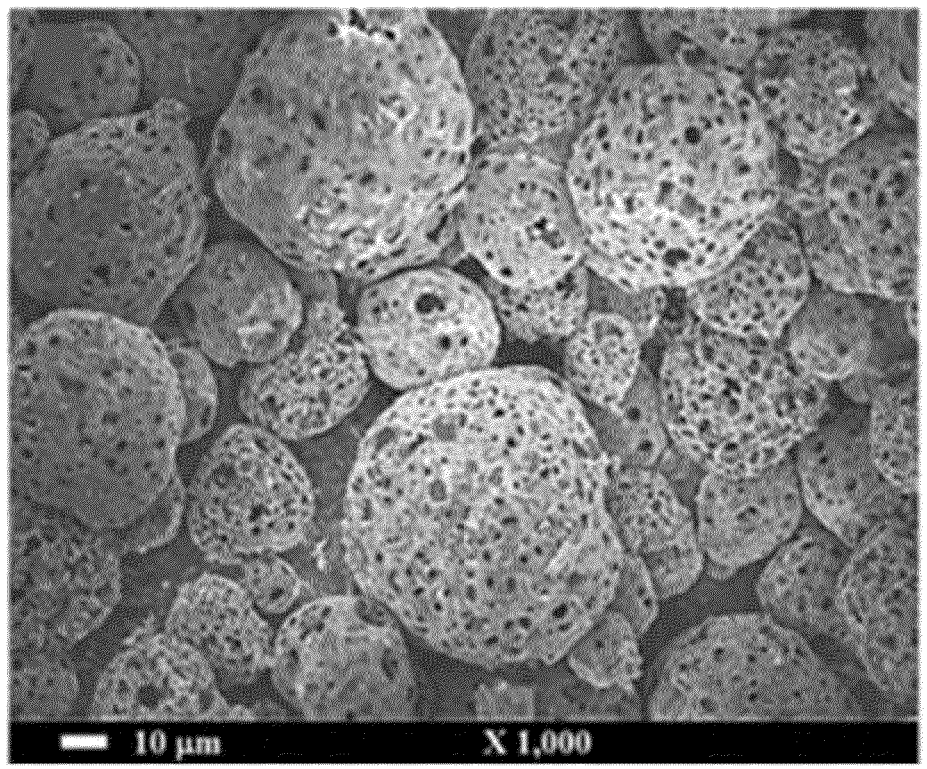
FIGS. 1A-1B shows SEM images of oil fly ash powder (FIG. 1A) and ball milled oil fly ash powder (FIG. 1B).

In the following description, it is understood that other embodiments may be utilized and structural and operational changes may be made without departure from the scope of the present embodiments disclosed herein.

Definitions

The present disclosure will be better understood with reference to the following definitions. As used herein, the words "a" and "an" and the like carry the meaning of "one or more." Within the description of this disclosure, where a numerical limit or range is stated, the endpoints are included unless stated otherwise.

As used herein, the words "about," "approximately," and "substantially similar" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), +/−15% of the stated value (or range of values), or +/−20% of the stated value (or range of values).

Within the description of this disclosure, where a numerical limit or range is stated, the endpoints are included unless stated otherwise. Also, all values and subranges within a numerical limit or range are specifically included as if explicitly written out.

As used herein, "binder" refers to compounds or substances which holds or draws other materials together to form a cohesive whole mechanically, chemically, by adhesion or cohesion.

As used herein, "compound" is intended to refer to a chemical entity, whether as a solid, liquid, or gas, and whether in a crude mixture or isolated and purified.

As used herein, "composite" refers to a combination of two or more distinct constituent materials into one. The individual components, on an atomic level, remain separate and distinct within the finished structure. The materials may have different physical or chemical properties, that when combined, produce a material with characteristics different from the original components. In some embodiments, a composite may have at least two constituent materials that comprise the same empirical formula but are distinguished by different densities, crystal phases, or a lack of a crystal phase (i.e. an amorphous phase). The term "nanocomposite" refers to a composite in which one or more of the constituent materials is a nanomaterial.

The term "mesopore" as used herein refers to a pore having a diameter of 40 to 100 Å. The term "micropore" refers to a pore having a diameter of less than 40 Å. The term "macropore" refers to a pore having a diameter that exceeds 100 Å.

As used herein, the terms "optional" or "optionally" means that the subsequently described event(s) can or cannot occur or the subsequently described component(s) may or may not be present (e.g., 0 wt. %).

According to a first aspect, the present disclosure relates to a nanocomposite comprising porous carbonaceous particles, electrically conductive carbon nanotubes, and a binder.

In some embodiments, the nanocomposite comprises 80 to 95 wt %, preferably 82.5 to 94 wt %, preferably 85 to 93 wt %, preferably 87.5 to 92 wt %, preferably 88.5 to 91.5 wt %, preferably 89.0 to 91.25 wt %, preferably 89.25 to 91.0 wt %, preferably 89.5 to 90.75 wt %, preferably 89.75 to 90.5 wt %, preferably 90.0 to 90.25 wt % porous carbonaceous particles, based on a total weight of nanocomposite. In some embodiments, the nanocomposite comprises 1 to 10 wt %, electrically conductive, preferably 1.5 to 8.5 wt %, preferably 2.0 to 7.5 wt %, preferably 2.5 to 6.0 wt %, preferably 2.75 to 5.0 wt %, preferably 3.0 to 4.75 wt %, preferably 3.25 to 4.5 wt %, preferably 3.5 to 4.25 wt %, preferably 3.75 to 4.0 wt %, preferably 3.8 to 3.9 wt % carbon nanotubes, based on a total weight of nanocomposite. In some embodiments, the nanocomposite comprises 2.5 to 12.5 wt %, preferably 3.0 to 10.0 wt %, preferably 4.0 to 8.0 wt %, preferably 4.5 to 7.5 wt %, preferably 5.0 to 7.0 wt %, preferably 5.25 to 6.75 wt %, preferably 5.5 to 6.5 wt %, preferably 5.75 to 6.25 wt %, preferably 5.9 to 6.1 wt % a binder, based on a total weight of nanocomposite.

Porous Carbonaceous Particles

In some embodiments, the porous carbonaceous particles comprise 88.5 to 96.45 wt % carbon, preferably 89.0 to 96.25 wt %, preferably 90.0 to 96.0 wt %, preferably 91.5 to 95.5 wt % carbon, preferably 91.0 to 95.0 wt % carbon, preferably 91.25 to 94.5 wt % carbon, preferably 91.5 to 94.25 wt % carbon, preferably 91.75 to 94.0 wt % carbon, preferably 92.0 to 93.75 wt %, carbon preferably 92.25 to 93.5 wt % carbon, preferably 92.5 to 93.25 wt % carbon, preferably 92.75 to 93.0 wt % carbon, based on a total weight of porous carbonaceous particles.

In some embodiments, the porous carbonaceous particles comprise 1.0 to 3.0 wt % oxygen, preferably 1.25 to 2.75 wt % oxygen, preferably 1.5 to 2.5 wt % oxygen, preferably 1.75 to 2.25 wt % oxygen, preferably 1.9 to 2.2 wt % oxygen, preferably 2.0 to 2.1 wt % oxygen, based on a total weight of porous carbonaceous particles.

In some embodiments, the porous carbonaceous particles comprise 2.5 to 7.5 wt % sulfur, preferably 3.0 to 7.0 wt % sulfur, preferably 3.25 to 6.5 wt % sulfur, preferably 3.5 to 6.25 wt % sulfur, preferably 3.75 to 6.0 wt % sulfur, preferably 4.0 to 5.75 wt % sulfur, preferably 4.25 to 5.5 wt % sulfur, preferably 4.5 to 5.25 wt % sulfur, preferably 4.75 to 5.0 wt % sulfur, based on a total weight of porous carbonaceous particles.

In some embodiments, the porous carbonaceous particles comprise 0.05 to 1.0 wt % vanadium, preferably 0.10 to 0.90 wt % vanadium, preferably 0.15 to 0.75 wt % vanadium, preferably 0.20 to 0.60 wt % vanadium, preferably 0.25 to 0.50 wt % vanadium, based on a total weight of porous carbonaceous particles.

In some embodiments, the porous carbonaceous particles can further include an impurity element which is at least one selected from the group consisting of metals or semimetals such as iron, aluminum, magnesium, calcium, nickel, copper, zinc chromium, cobalt, lead, manganese, mercury, molybdenum, selenium, strontium, thallium, arsenic, beryllium, boron, cadmium, and silicon. In some embodiments, the porous carbonaceous particles are substantially free of an impurity element. In some embodiments, the carbonaceous particles are devoid of an impurity element. That is, the carbonaceous particles do not contain a detectable amount of the impurity element. In some embodiments, the porous carbonaceous particles are substantially free of iron. In some embodiments, the porous carbonaceous particles are devoid of iron.

The aforementioned weight percentages of carbon, oxygen, sulfur, vanadium, and impurity elements such as iron may be determined by elemental analysis techniques such as energy-dispersive X-ray spectroscopy (EDS), X-ray photoelectron spectroscopy (XPS), inductively coupled plasma mass spectrometry (ICP-MS), neutron activation analysis, and a combination thereof.

In general, the porous carbonaceous particles can be any shape known to one of ordinary skill in the art. Examples of suitable shapes the porous carbonaceous particles may take include spheres, spheroids, lentoids, ovoids, solid polyhedra such as tetrahedra, cubes, octahedra, icosahedra, dodecahedra, hollow polyhedra (also known as nanocages), stellated polyhedra (both regular and irregular, also known as nanostars), triangular prisms (also known as nanotriangles), hollow spherical shells (also known as nanoshells), tubes (also known as nanotubes), nanosheets, nanoplatelets, nanodisks, rods (also known as nanorods), and mixtures thereof. In the case of nanorods, the rod shape may be defined by a ratio of a rod length to a rod width, the ratio being known as the aspect ratio. For porous carbonaceous particles of the current invention, nanorods should have an aspect ratio less than 1000, preferably less than 750, preferably less than 500, preferably less than 250, preferably less than 100, preferably less than 75, preferably less than 50, preferably less than 25. Nanorods having an aspect ratio greater than 1000 are typically referred to as nanowires and are not a shape that the porous carbonaceous particles are envisioned as having in any embodiments.

In some embodiments, the porous carbonaceous particles have uniform shape. Alternatively, the shape may be non-uniform. As used herein, the term "uniform shape" refers to an average consistent shape that differs by no more than 10%, by no more than 5%, by no more than 4%, by no more than 3%, by no more than 2%, by no more than 1% of the distribution of porous carbonaceous particles having a different shape. As used herein, the term "non-uniform shape" refers to an average consistent shape that differs by more than 10% of the distribution of porous carbonaceous particles having a different shape. In one embodiment, the shape is uniform and at least 90% of the porous carbonaceous particles are spherical or substantially circular, and less than 10% are polygonal. In another embodiment, the shape is non-uniform and less than 90% of the porous carbonaceous particles are spherical or substantially circular, and greater than 10% are polygonal.

In some embodiments, the porous carbonaceous particles have a mean particle size of 5 to 100 nm, preferably 7.5 to 75 nm, preferably 10 to 60 nm, preferably 12.5 to 50 nm, preferably 15 to 40 nm, preferably 15.5 to 35 nm, preferably about 20 to 30 nm. In embodiments where the porous carbonaceous particles are spherical, the particle size may refer to a particle diameter. In embodiments where the porous carbonaceous particles are polyhedral, the particle size may refer to the diameter of a circumsphere. In some embodiments, the particle size refers to a mean distance from a particle surface to particle centroid or center of mass. In alternative embodiments, the particle size refers to a maximum distance from a particle surface to a particle centroid or center of mass. In some embodiments where the porous carbonaceous particles have an anisotropic shape such as nanorods, the particle size may refer to a length of the nanorod, a width of the nanorod, an average of the length and width of the nanorod. In some embodiments in which the porous carbonaceous particles have non-spherical shapes, the particle size refers to the diameter of a sphere having an equivalent volume as the particle. In some embodiments in which the porous carbonaceous particles have non-spherical shapes, the particle size refers to the diameter of a sphere having an equivalent diffusion coefficient as the particle.

In some embodiments, the porous carbonaceous particles of the present disclosure are monodisperse, having a coefficient of variation or relative standard deviation, expressed as a percentage and defined as the ratio of the particle size standard deviation ($\sigma$) to the particle size mean ($\mu$) multiplied by 100 of less than 25%, preferably less than 10%, preferably less than 8%, preferably less than 6%, preferably less than 5%, preferably less than 4%, preferably less than 3%, preferably less than 2%. In some embodiments, the porous carbonaceous particles of the present disclosure are monodisperse having a particle size distribution ranging from 80% of the average particle size to 120% of the average particle size, preferably 90-110%, preferably 95-105% of the average particle size. In some embodiments, the porous carbonaceous particles are not monodisperse.

In general, the particle size may be determined by any suitable method known to one of ordinary skill in the art. In some embodiments, the particle size is determined by powder X-ray diffraction (PXRD). Using PXRD, the particle size may be determined using the Scherrer equation, which relates the full-width at half-maximum (FWHM) of diffraction peaks to the size of regions comprised of a single crystalline domain (known as crystallites) in the sample. In some embodiments, the crystallite size is the same as the particle size. For accurate particle size measurement by PXRD, the particles should be crystalline, comprise only a single crystal, and lack non-crystalline portions. Typically, the crystallite size underestimates particle size compared to other measures due to factors such as amorphous regions of particles, the inclusion of non-crystalline material on the surface of particles such as bulky surface ligands, and particles which may be composed of multiple crystalline domains. In some embodiments, the particle size is determined by dynamic light scattering (DLS). DLS is a technique which uses the time-dependent fluctuations in light scattered by particles in suspension or solution in a solvent, typically water to measure a size distribution of the particles. Due to the details of the DLS setup, the technique measures a hydrodynamic diameter of the particles, which is the diameter of a sphere with an equivalent diffusion coefficient as the particles. The hydrodynamic diameter may include factors not accounted for by other methods such as non-crystalline material on the surface of particles such as bulky surface ligands, amorphous regions of particles, and surface ligand-solvent interactions. Further, the hydrodynamic diameter may not accurately account for non-spherical particle shapes. DLS does have an advantage of being able to account for or more accurately model solution or suspension behavior of the particles compared to other techniques. In some embodiments, the particle size is determined by electron microscopy techniques such as scanning electron microscopy (SEM) or transmission electron microscopy (TEM).

In some embodiments, the porous carbonaceous particles are substantially spherical and have a mean particle size of 5 to 100 nm.

In some embodiments, the porous carbonaceous particles a Brunauer-Emmett-Teller (BET) surface area of 10 to 1000 $m^2/g$, preferably 15 to 900 $m^2/g$, 20 to 800 $m^2/g$, preferably 25 to 750 $m^2/g$, preferably 30 to 700 $m^2/g$, preferably 40 to 600 $m^2/g$, preferably 50 to 500 $m^2/g$, preferably 60 to 400 $m^2/g$, preferably 75 to 300 $m^2/g$, preferably 100 to 250 $m^2/g$.

In some embodiments, the porous carbonaceous particles have a total pore volume of 0.05 to 1.00 $cm^3/g$, preferably 0.10 to 0.75 $cm^3/g$, more preferably 0.15 to 0.70 $cm^3/g$, preferably 0.20 to 0.60 $cm^3/g$, preferably 0.25 to 0.50 $cm^3/g$. In some embodiments, the porous carbonaceous particles have a mean pore size of 5 to 250 Å, preferably 10 to 225 Å, preferably 15 to 200 Å, preferably 20 to 175 Å, preferably 25 to 150 Å, preferably 30 to 125 Å, preferably 35 to 100 Å.

In some embodiments, at least 50% of the pores are in the diameter range of 5 to 250 Å, preferably 50 to 95%, preferably 60 to 90%, preferably 70 to 85%. In some embodiments, the porous carbonaceous particles have a macropore/mesopore amount ratio of 0.001 to 0.05, preferably 0.002 to 0.02, preferably 0.005 to 0.01. In some embodiments, the porous carbonaceous particles have a micropore/mesopore amount ratio of 0.002 to 0.1, preferably 0.005 to 0.05, preferably 0.01 to 0.03. Pore size may be determined by techniques including, but not limited to, gas adsorption (e.g. $N_2$ adsorption), mercury intrusion porosimetry, and imaging techniques such as scanning electron microscopy (SEM), and x-ray computed tomography (XRCT).

Electrically Conductive Carbon Nanotubes

The carbon nanotubes may, in general, be any suitable carbon nanotubes known to one of ordinary skill in the art. Carbon nanotubes may be classified by structural properties such as the number of walls or the geometric configuration of the atoms that make up the nanotube. Classified by their number of walls, the carbon nanotubes can be single-walled carbon nanotubes (SWCNT) which have only one layer of carbon atoms arranged into a tube, or multi-walled carbon nanotubes (MWCNT), which have more than one single-layer tube of carbon atoms arranged so as to be nested, one tube inside another, each tube sharing a common orientation. Closely related to MWNTs are carbon nanoscrolls. Carbon nanoscrolls are structures similar in shape to a MWCNT but made of a single layer of carbon atoms that has been rolled onto itself to form a multi-layered tube with a free outer edge on the exterior of the nanoscroll and a free inner edge on the interior of the scroll and open ends. The end-on view of a carbon nanoscroll has a spiral-like shape. For the purposes of this disclosure, carbon nanoscrolls are considered a type of MWCNT. Classified by the geometric configuration of the atoms that make up the nanotube, carbon nanotubes can be described by a pair of integer indices n and m. The indices n and m denote the number of unit vectors along two directions in the honeycomb crystal lattice of a single layer of carbon atoms. If m=0, the nanotubes are called zigzag type nanotubes. If n=m, the nanotubes are called armchair type nanotubes. Otherwise, they are called chiral type nanotubes. In some embodiments, the carbon nanotubes are metallic. In other embodiments, the carbon nanotubes are semiconducting. In some embodiments, the carbon nanotubes are SWCNTs. In other embodiments, the carbon nanotubes are MWCNTs. In some embodiments, the carbon nanotubes are carbon nanoscrolls. In some embodiments, the carbon nanotubes are zigzag type nanotubes. In alternative embodiments, the carbon nanotubes are armchair type nanotubes. In other embodiments, the carbon nanotubes are chiral type nanotubes.

In some embodiments, the electrically conductive carbon nanotubes have an electrical conductivity in compact pellet form of 75,000 to 100,000 S/m, preferably 80,000 to 95,000 S/m, preferably 81,000 to 94,000 S/m, preferably 82,000 to 93,000 S/m, preferably 83,000 to 92,000 S/m, preferably 84,000 to 91,000 S/m, preferably 85,000 to 90,000 S/m, preferably 85,500 to 89,500 S/m, preferably 86,000 to 88,000 S/m, preferably 86,500 to 87,500 S/m at 233 K. In some embodiments, the electrically conductive carbon nanotubes have an electrical conductivity in compact pellet form of 50,000 to 90,000 S/M, preferably 55,000 to 80,000 S/m, 59,000 to 76,000 S/m, preferably 60,000 to 75,000 S/m, preferably 61,000 to 74,000 S/m, preferably 62,000 to 73,000 S/m, preferably 63,000 to 72,000 S/m, preferably 64,000 to 71,000 S/m, preferably 65,000 to 70,000 S/m, preferably 66,500 to 69,500 S/m, preferably 67,000 to 69,000 S/M, preferably 67,500 to 68,500 S/m at 393 K.

In some embodiments, the electrically conductive carbon nanotubes have a mean diameter of 0.25 to 10 nm, preferably 0.5 to 9.5 nm, preferably 0.75 to 9.0 nm, preferably 1 to 8.5 nm, preferably 1.25 to 8.0 nm, preferably 1.5 to 7.5 nm, preferably 1.75 to 7.25 nm, preferably 2 to 7 nm. In some embodiments, the electrically conductive carbon nanotubes of the present disclosure have a diameter which is monodisperse, having a coefficient of variation or relative standard deviation, expressed as a percentage and defined as the ratio of the diameter standard deviation ($\sigma$) to the diameter mean ($\mu$) multiplied by 100 of less than 25%, preferably less than 10%, preferably less than 8%, preferably less than 6%, preferably less than 5%, preferably less than 4%, preferably less than 3%, preferably less than 2%. In some embodiments, the electrically conductive carbon nanotubes of the present disclosure are monodisperse having a diameter distribution ranging from 80% of the average diameter to 120% of the average diameter, preferably 90-110%, preferably 95-105% of the average diameter. In some embodiments, the electrically conductive carbon nanotubes do not have a diameter which is monodisperse.

Binder

Examples of binders include, but are not limited to epoxy resins, modified epoxy resins, polyester resins, novolak resins, cellulosic materials, hydroxypropylcellulose, hydroxyethylcellulose, hydroxypropylmethylcellulose, carboxymethylcellulose, copolymers of vinylidene chloride and acrylonitrile, acrylic acid resins, polyvinyl resins, silicone resins, polyamide resins, vinyl alcohol resins, resol resins, acetal resins, polyacrylonitrile resins, formaldehyde resins, polycarbonate resins, polyimide resins, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, epoxy resins produced by the condensation of epichlorohydrin and Bisphenol A or F, epoxy novolak resins, rubber modified epoxy resins, Bisphenol A based polyester resins, epoxydized o-cresylic novolaks, urethane modified epoxy resins, phosphate modified Bisphenol A epoxy resins, cellulose esters, copolymers of vinylidene chloride and acrylonitrile, poly(meth)acrylates, polyvinyl chloride, silicone resins, polyesters containing hydroxy or carboxy groups, polyamides comprising amino groups or carboxy groups, polymers and copolymers of vinyl alcohol, polyvinylimidazole, polyvinylpyrrolidone, polymers and copolymers of vinylphenol, acrylamide, methylol acrylamide, methylol methacrylamide, polyacrylic acid, methacrylic acid, hydroyethyl acrylate, hydroxethyl methacrylate, maleic anhydride/vinyl methyl ether copolymers, novolak resin, resol resin, polyvinyl phenol resin, copolymers of acrylic acid, polyacetal, poly(methyl methacrylate), polymethacrylic acid, polyacrylonitrile, cellulose acetate, cellulose acetate butyrate, cellulose acetate propionate, melamine formaldehyde resins, polycarbonates, polyimides, and urea formaldehyde resins. Commonly used binders include polyvinylalochol (PVA), sulfosuccinic-acid (SSA), fluorinated polymers such as polytetrafluoroethylene (PTFE), polyethylene chlorotrifluoroethylene (ECTFE), polyethylene tetrafluoroethylene (ETFE), fluorinated-ethylene-propylene (FEP), perfluoro-alkoxy (PFA), polychlorotrifluoroethylene (PCTFE), sulfonated tetrafluoroethylene (NafionR), and polyvinylidenefluoride (PVDF), polymethyl methacrylate (PMMA), and phenolic/resol type polymers crosslinked with, for example poly(methyl vinyl ether-alt-maleic anhydride), poly(methyl vinyl ether-alt-maleic acid), and/or poly(acrylamide-co-diallyldimethylammonium chloride) (PDADAM).

In some embodiments, the binder is non-conducting. In some embodiments, the binder is conducting. In some embodiments, the binder is a conducting polymer. Examples of conducting polymers include, but are not limited to polyaniline (PANI), polypyrrole (PPy), polythiophene (PTh), polyphenylene sulfide (PPS), polyacetylene (PA), polyphenylene vinylene (PPV), poly(3,4-ethylenedioxythiophene) (PEDOT), polycarbazole (PCz), polyindole (PIn), polyazepine, polypyrene (PP), polyazulene (PAz), polynaphthalene, poly(para-phenylene) (PPP), poly (3-alkyl-thiophenes) such as poly (3-hexyl thiophene), poly (3-methyl thiophene) and poly-(3-octyl thiophene), polyisothianapthene, poly-(3-thienylmethylacetate), polyquinoline, polyheteroarylenvinylene, in which a heteroarylene group may include, but is not limited to, a thiophene, a furan or a pyrrole, poly-(3-thienylethylacetate), and derivatives, copolymers and combinations thereof.

In some embodiments, the binder is polymethyl methacrylate (PMMA). In some embodiments, the PMMA has a mean molecular weight of 100,000 to 1,000,000 g/mol, preferably 150,000 to 750,000 g/mol, preferably 200,000 to 650,000 g/mol, preferably 250,000 to 500,000 g/mol, preferably 300,000 to 400,000 g/mol, preferably 325,000 to 375,000 g/mol, preferably about 350,000 g/mol. In some embodiments, the mean molecular weight is a number-average molecular weight. In some embodiments, the mean molecular weight is a weight-average molecular weight.

Properties of Nanocomposite

In some embodiments, the nanocomposite has a density of 0.50 to 0.60 $g/cm^3$, preferably 0.51 to 0.59 $g/cm^3$, preferably 0.52 to 0.58 $g/cm^3$, preferably 0.525 to 0.575 $g/cm^3$, preferably 0.535 to 0.570 $g/cm^3$, preferably 0.545 to 0.565 $g/cm^3$, preferably 0.550 to 0.560 $g/cm^3$, preferably 0.5525 to 0.5575 $g/cm^3$.

In some embodiments, the nanocomposite has an electrical conductivity of 18,250 to 21,000 S/m, preferably 18,500 to 20,750 S/m, preferably 18,750 to 20,500 S/m, preferably 19,000 to 20,000 S/M at 233 K. In some embodiments, the nanocomposite has an electrical conductivity of 16,500 to less than 18,250 S/m, preferably 17,000 to 18,000 S/m preferably 17,250 to 17,750 S/m, preferably 17,500 S/m at 393 K.

In some embodiments, the nanocomposite has a Seebeck value of 24 to 27 µV/K, preferably 24.5 to 26.75 µV/K, preferably 25 to 26.5 µV/K at 233 K. In some embodiments, the nanocomposite has a Seebeck value of 30 to 34 µV/K, preferably 30.5 to 33 µV/K, preferably 31 to 33 µV/K, preferably 31.5 to 32.75 µV/K, preferably 32 to 32.5 µV/K at 393 K.

In some embodiments, the nanocomposite has a power factor of 10 to 14.0 µw/$mK^2$, preferably 10.5 to 13.5 µw/$mK^2$, preferably 11.0 to 13.0 µw/$mK^2$, preferably 11.25 to 12.75 paw/$mK^2$, preferably 11.5 to 12.5 µw/$mK^2$, preferably 11.75 to 12.25 µw/$mK^2$, preferably 11.9 to 12.1 µw/$mK^2$ at 233 K. In some embodiments, the nanocomposite has a power factor of greater than 14.0 to 18 µw/$mK^2$, preferably 14.25 to 17.75 µw/$mK^2$, preferably 14.5 to 17.5 paw/$mK^2$, preferably 14.75 to 17.25 µw/$mK^2$, preferably 15.0 to 17.0 µw/$mK^2$, preferably 15.25 to 16.75 µw/$mK^2$, preferably 15.5 to 16.5 µw/$mK^2$, preferably 15.75 to 16.25 µw/$mK^2$, preferably 15.9 to 16.1 µw/$mK^2$ at 393 K.

In some embodiments, the nanocomposite has a thermoelectric figure of merit ZT of 0.018 to 0.026, preferably 0.019 to 0.025, preferably 0.020 to 0.024, preferably 0.0205 to 0.0235, preferably 0.021 to 0.023, preferably 0.0215 to 0.0225, preferably 0.022 at 293 K. In some embodiments, the nanocomposite has a thermoelectric figure of merit ZT of 0.016 to 0.024, preferably 0.017 to 0.023, preferably 0.018 to 0.022, preferably 0.0185 to 0.0215, preferably 0.019 to 0.021, preferably 0.0195 to 0.0205, preferably 0.020 at 393 K.

In some embodiments, the nanocomposite has a thermal conductivity of 0.150 to 0.200 W/m·K, preferably 0.155 to 0.195 W/m·K, preferably 0.160 to 0.190 W/m·K, preferably 0.165 to 0.185 W/m·K, preferably 0.170 to 0.180 W/m·K, preferably 0.172 to 0.176 W/m·K, preferably 0.173 to 0.175 W/m·K, preferably 0.174 W/m·K at 293 K. In some embodiments, the nanocomposite has a thermal conductivity of 0.300 to 0.350 W/m·K, preferably 0.305 to 0.345 W/m·K, preferably 0.310 to 0.340 W/m·K, preferably 0.315 to 0.335 W/m·K, preferably 0.320 to 0.330 W/m·K, preferably 0.322 to 0.328 W/m·K, preferably 0.325 to 0.327 W/m·K, preferably 0.326 W/m·K at 393 K.

In some embodiments, the nanocomposite has a specific heat (Cp) of 0.325 to 0.400 J/gK, preferably 0.330 to 0.395 J/gK, preferably 0.3335 to 0.390 J/gK, preferably 0.340 to 0.385 J/gK, preferably 0.345 to 0.380 J/gK, preferably 0.350 to 0.375 J/gK, preferably 0.355 to 0.370 J/gK, preferably 0.360 to 0.365 J/gK, preferably 0.364 J/gK at 293 K. In some embodiments, the nanocomposite has a specific heat of 0.395 to 0.450 J/gK, preferably 0.400 to 0.445 J/gK, preferably 0.405 to 0.440 J/gK, preferably 0.410 to 0.435 J/gK, preferably 0.415 to 0.430 J/gK, preferably 0.420 to 0.425 J/gK, preferably 0.424 J/gK at 393 K.

In some embodiments, the nanocomposite has a carrier density of $0.5 \times 10^{19}$ to $2.0 \times 10^{19}$ cm$^{-1}$, preferably $1.00 \times 10^{19}$ to $1.40 \times 10^{19}$ cm$^{-1}$, preferably $1.05 \times 10^{19}$ to $1.35 \times 10^{19}$ cm$^{-1}$, preferably $1.10 \times 10^{19}$ to $1.30 \times 10^{19}$ cm$^{-1}$, preferably $1.125 \times 10^{19}$ to $1.275 \times 10^{19}$ cm$^{-1}$, preferably $1.15 \times 10^{19}$ to $1.25 \times 10^{19}$ cm$^{-1}$, preferably $1.175 \times 10^{19}$ to $1.225 \times 10^{19}$ cm$^{-1}$, preferably $1.2 \times 10^{19}$ cm$^{-1}$ at 233 K. In some embodiments, the nanocomposite has a carrier density of $4.0 \times 10^{19}$ to $7.5 \times 10^{19}$ cm$^{-1}$, preferably $5.0 \times 10^{19}$ to $6.0 \times 10^{19}$ cm$^{-1}$, preferably $5.20 \times 10^{19}$ to $5.60 \times 10^{19}$ cm$^{-1}$, preferably $5.25 \times 10^{19}$ to $5.55 \times 10^{19}$ cm$^{-1}$, preferably $5.30 \times 10^{19}$ to $5.50 \times 10^{19}$ cm$^{-1}$, preferably $5.325 \times 10^{19}$ to $5.475 \times 10^{19}$ cm$^{-1}$, preferably $5.35 \times 10^{19}$ to $5.45 \times 10^{19}$ cm$^{-1}$, preferably $5.375 \times 10^{19}$ to $5.425 \times 10^{19}$ cm$^{-1}$, preferably $5.4 \times 10^{19}$ cm$^{-1}$ at 393 K.

In some embodiments, the nanocomposite has a Hall mobility of 8.0 to 12.0 cm$^2$/V·s, preferably 8.5 to 11.5 cm$^2$/V·s, preferably 9.0 to 11.0 cm$^2$/V·s, preferably 9.25 to 10.75 cm$^2$/V·s, preferably 9.50 to 10.50 cm$^2$/V·s, preferably 9.75 to 10.25 cm$^2$/V·s, preferably 9.9 to 10.1 cm$^2$/V·s, preferably 10 cm$^2$/V·s at 233K. In some embodiments, the nanocomposite has a Hall mobility of 0.5 to 4.0 cm$^2$/V·s, preferably 0.75 to 3.5 cm$^2$/V·s, preferably 1.0 to 3.0 cm$^2$/V·s, preferably 1.25 to 2.75 cm$^2$/V·s, preferably 1.50 to 2.50 cm$^2$/V·s, preferably 1.75 to 2.25 cm$^2$/V·s, preferably 1.9 to 2.1 cm$^2$/V·s, preferably 2 cm$^2$/V·s at 393K Method of Forming Nanocomposite The present disclosure also relates to a method of forming the nanocomposite. In some embodiments, the method involves dispersing the porous carbonaceous particles and the electrically conducive carbon nanotubes in a first solvent to form a carbonaceous suspension. In some embodiments, the method involves dissolving the binder in a second solvent to form a binder solution. In some embodiments, the method comprises mixing the carbonaceous suspension and the binder solution at room temperature to form a mixture.

In general, the first solvent can be any suitable solvent. In some embodiments, the first solvent is an organic solvent. In some embodiments, the second solvent is an organic solvent. Examples of organic solvents include, but are not limited to, alcohols such as methanol, ethanol, n-propanol, 2-propanol (also known as isopropanol), ethylene glycol, diethylene glycol, and glycerol; hydrocarbons such as pentane, hexane, and heptane; ketones such as acetone and methyl ethyl ketone; esters such as ethyl acetate; amides such as dimethylformamide; ethers such as tetrahydrofuran, diglyme, and diethyl ether; nitriles such as acetonitrile; halogenated organic solvents such as methylene chloride (also known as dichloromethane), carbon tetrachloride, and chloroform; aromatic organic solvents such as benzene and xylene; amines such as trimethylamine and pyridine; and mixtures thereof. In some embodiments, the first solvent is a halogenated organic solvent. In some embodiments, the first solvent is chloroform. In some embodiments, the second solvent is a halogenated organic solvent. In some embodiments, the second solvent is chloroform. In some embodiments, both the first solvent and the second solvent are chloroform.

In general, the porous carbonaceous particles can be present in the carbonaceous suspension in any suitable amount. In general, the electrically conductive carbon nanotubes can be present in the carbonaceous suspension in any suitable amount. In general, the binder can be present in the binder solution in any suitable amount. In general, the carbonaceous suspension and the binder solution can be mixed in any suitable amount to form the mixture. In some embodiments, the mixture comprises an amount of the porous carbonaceous particles, electrically conductive carbon nanotubes, and binder equal to the nanocomposite as described above.

In some embodiments, the method involves casting the mixture in a mold to form an intermediate product, and annealing the intermediate product at 75 to 150° C., preferably 80 to 140° C., preferably 85 to 130° C., preferably 90 to 120° C., preferably 95 to 110° C., preferably 100° C. to form the nanocomposite.

In some embodiments, the method further comprises forming the porous carbonaceous particles. In some embodiments, the porous carbonaceous particles are formed from oil fly ash.

Fly and bottom ash are generated upon burning coal, heavy fuel oil, or other fossil fuels and are thus byproducts of power generation from petroleum sources. In such power plants, fly ash of variable particle diameters are emitted, leaving the bottom ash in the combustor. Fly ash may be separated from the emissions with an electrostatic precipitator, and the recovered fly ash may be directly discharged into landfills and ash ponds or used in concrete or other construction materials.

The chemical composition of fly ash is dependent upon the nature of the feeding fuel, (e.g., coal, petroleum, or sometimes wood) and each fuel source provides distinct chemical compositions and properties to the resulting fly ash. Fly ash which is derived from coal sources such as bituminous coal, sub-bituminous coal, and lignite is termed "coal fly ash", and is characterized by high contents of $SiO_2$, $Al_2O_3$, $Fe_2O_3$, and CaO. According to ASTM C618, coal fly ash is categorized into Class F or Class C based on the content of Si, Al, and Ca. Coal fly ash can be categorized as siliceous fly ash or calcareous fly ash, depending on the amount of Si or Ca present, respectively. Coal fly ash also has a low carbon content, less than 15 wt %, and in many cases less than 5 wt %, as determined by loss on ignition (LOI) values according to ASTM D7348 for example, or TGA-MS analysis. Fly ash of coal origin may also contain trace metals such as As, Be, B, Cd, Cr, Co, Mg, Mo, Pb, Se, V, Ni, Cu, and Zn.

Wood fly ash, or fly ash obtained from combustion of wood or wood-based biomass varies depending of the wood source. However, most wood fly ash contains a high calcium and silica content. Other waste wood combustion materials, in addition to wood fly ash, similarly have high silica and CaO contents.

Oil fly ash, which is obtained from combustion of oil-based sources such as heavy oil, diesel, and natural gas sources in power stations or water desalination plants, differs greatly in composition from coal and wood fly ash. Some exemplary oil sources include, but are not limited to, residual fuel oil, light Arabian crude oil, and heavy Arabian crude oil. Compared to coal and wood fly ash, oil fly ash has a high carbon content and a low content of Si, Al, and Ca, as determined, for example, by X-ray diffraction, ASTM D7348, and/or ASTM C618 See Al-Malack et al. Characteristics of Fly ash Produced at Power and Water Desalination Plants Firing Fuel Oil, Int. J. Environ. Res., 2013, 7(2), 455-466—incorporated herein by reference in its entirety.

In some embodiments, the oil fly ash employed herein has a carbon content of greater than 50 wt %, preferably greater than 60 wt %, preferably greater than 70 wt %, based on a total weight of the oil fly ash. Oil fly ash typically has a higher carbon content than other types of fly ash, but a lower carbon content than that of carbonaceous combustion products such as carbon black, which has a carbon content of 96 to 99.5 wt % (and typically only 0.2 to 0.5 wt % of oxygen containing materials).

Other elements besides carbon may be present in the oil fly ash. For example, alkali metals such as lithium, sodium, and potassium, alkaline earth metals such as magnesium, calcium, and strontium, sulfur, boron, oxygen, nitrogen, phosphorus, silicon, and metals such as Fe, Ti, V, Cr, Mn, Co, Ni, Cu, Zn, and the like. Such elements may be present as oxides, such as $Fe_2O_3$ and $Na_2O$.

In one embodiment, the oil fly ash is in the form of porous particles having an average particle diameter of 10 to 120 μm, preferably 15 to 100 μm, preferably 30 to 80 μm, preferably 40 to 60 μm. However, in some embodiments, the oil fly ash may have an average particle diameter of smaller than 10 μm or greater than 120 μm. In some embodiments, the oil fly ash may have an average pore diameter of 0.05 to 10 μm, preferably 0.1 to 5 μm, preferably 0.25 to 7.5 μm, preferably 0.5 to 5 μm.

In some embodiments, the porous carbonaceous particles are formed from the oil fly ash by a method involving milling. The product of this milling may be referred to as a milled ash. In general, the milling may be performed by any suitable technique or with any suitable equipment known to one of ordinary skill in the art. Examples of such techniques include, but are not limited to, grinding, ball milling, chopping, pulverizing, crushing, pounding, mincing, shredding, smashing, and fragmenting. In some embodiments, the milling may take place using a mill, ball mill, rod mill, autogenous mill, cutting mill, semi-autogenous grinding mill, pebble mill, buhrstone mill, burr mill, tower mill, vertical shaft impactor mill, a low energy milling machine, grinder, pulverizer, mortar and pestle, blender, crusher, or other implement used to reduce a material to small particles. In some embodiments, the milling is high-energy ball milling.

In some embodiments, the milling is performed for 12 to 48 h, preferably 14 to 46 hours, preferably 16 to 44 hours, preferably 18 to 42 hours, preferably 20 to 40 hours, preferably 22 to 38 hours, preferably 24 to 36 hours, preferably 26 to 34 hours, preferably 28 to 32 hours, preferably 29 to 31 hours, preferably 30 hours.

In some embodiments, the method of forming the porous carbonaceous particles involves treating the milled ash with an acid mixture to form a treated ash. The acid mixture contains two or more acids. The acids may be inorganic (mineral) acids or organic acids. Examples of inorganic acids include but are not limited to nitric acid, sulfuric acid, phosphoric acid, perchloric acid, hydrobromic acid, hydrochloric acid, hydroiodic acid, hydrofluoric acid, boric acid, and the like. Examples of organic acids include but are not limited to formic acid, acetic acid, propionic acid, butyric acid, valeic acid, caproic acid, oxalic acid, lactic acid, malic acid, citric acid, carbonic acid, benzoic acid, phenol, uric acid, carboxylic acids, sulfonic acids, and the like. In some embodiments, the acid mixture contains one or more mineral acids. In some embodiments, the acid mixture contains two or more mineral acids. In some embodiments, the acid mixture comprises sulfuric acid. In some embodiments, the acid mixture comprises nitric acid. In some embodiments, the acid mixture comprises both sulfuric acid and nitric acid.

In general, the acid mixture can contain any number of acids mixed in any ratio. In some embodiments, the acid mixture has a mole ratio of sulfuric acid to nitric acid of 1:1 to 5:1, preferably 1.5:1 to 4.5:1, preferably 2:1 to 4:1, preferably 2.25:1 to 3.75:1, preferably 2.5:1 to 3.5:1, preferably 2.75:1 to 3.25:1, preferably 2.9:1 to 3.1:1, preferably 3:1.

A treated ash is obtained at the end of the acid treatment. In some embodiments, the treated ash may be filtered and rinsed, (washed) for example, with distilled water. In general, the treated ash may be washed any number of times. In some embodiments, the treated ash is washed then dried. The washing with distilled water may be advantageous for removing residual acid solution, removing water-soluble impurities such as water-soluble compounds of various impurity elements discussed above. In some embodiments, the method involves drying the treated ash to form the porous carbonaceous particles.

The acid treatment and/or washing may be advantageous for removing various impurity elements as described above. For example, elements such as silicon, aluminum, iron, alkaline earth metals, and the like may be present as oxides or other compounds that are insoluble in water but are soluble in acid. Treatment with acid may remove such oxides or other compounds or convert them into water-soluble compounds which can be removed by washing. In some embodiments, the treated ash has a sulfur content which is lower than a sulfur content of the oil fly ash. In some embodiments, the treated ash has an iron content which is lower than an iron content of the oil fly ash. In some embodiments, the treated ash has an aluminum content which is lower than an aluminum content of the oil fly ash. In some embodiments, the treated ash has a sodium content which is lower than a sodium content of the oil fly ash. In some embodiments, the treated ash has a silicon content which is lower than a silicon content of the oil fly ash. In some embodiments, the treated ash has a copper content which is lower than a copper content of the oil fly ash. In some embodiments, the treated ash has a zinc content which is lower than a zinc content of the oil fly ash. In some embodiments, the treated ash has a nickel content which is lower than a nickel content of the oil fly ash.

Thermoelectric Device

The present disclosure also relates to a thermoelectric device, comprising a first electrode, a second electrode, and the nanocomposite, wherein the first electrode and second electrode are separated by the nanocomposite.

The examples below are intended to further illustrate protocols for preparing, characterizing, and using the nanocomposite and thermoelectric device and are not intended to limit the scope of the claims.

EXAMPLES

Experimental

Oil fly ash powder was collected from Jeddah power plant (Saudi Arabia). Highly electrical conducting single walls carbon nanotubes (SWCNT) were supplied from Ad-nano company, India. The oil fly ash powder sample was ball milled to reduce the particle size into the nano and submicron scale. It was ball milled for 30 h using a high-energy ball milling system. Then the obtained ball milled nanoparticle (BMN) sample was purified to remove the oxides and other metal contents. This purification was performed using a mixture of 70 wt % of DI water and 30 wt % of acids mixture. The acids mixture was made of $H_2SO_4$ and $HNO_3$ at the molar ratio 3:1. Then the sample was dried to get a powder sample, which was mixed with poly(methyl methacrylate) (PMMA). as a binder and SWCNT in a chloroform according to the desired composition ratios. In the first set of experiments the amount of SWCNT was fixed at 3 wt % and those of PMMA and BMN were varied. In the second set, the amount of SWCNT was changed from 2 to 6 wt % and these of BMN and PMMA were fixed at the desired concentration that has provided the best TE performance.

In a typical experiment, the composition of BMN:PMMA:SWCNT=0.375 gm:0.025 gm:0.016 gm was produced as follows: Initially the SWCNT powder was dispersed in 10 ml of chloroform, e.g. by sonication for 2-3 hrs, then into this solution the desired amount of BMN were added and again sonicated for 2 hrs. The PMMA powder was completely dissolved in a separate 10 ml chloroform by magnetically stirring the solution for 15-20 minutes. Then both solutions were mixed and kept under stirring for 1 h, followed by sonication for 1 h. Finally, the mixture was poured into either a small petri dish or aluminum mold and left to dry at room temperature (due to the volatile nature of chloroform, it can easily dry at room temperature). The dried nanocomposite sheet was annealed at 100° C. for 1 h and used to record TE and other measurements.

The produced BMN/SWCNT nanocomposite sheet with a thickness around 100 μm along with the original materials were characterized by scanning electron microscopy (SEM) (JSM-7500F, JEOL, Japan), field emission transmission electron microscopy (TEM) (JEM 2100F, JEOL), X-ray photoelectron spectroscopy (XPS) (PHI 5000 Versa Probe, Japan) and DXR Raman microscope (Thermo Fisher Scientific, USA). The TE performance was investigated by measuring the electrical conductivity, Seebeck coefficient and thermal conductivity. They were recorded for the produced nanocomposite sheets as a function of temperature. An LSR-3 Linseis-Seebeck coefficient and electrical resistivity system manufactured by Linseis, Germany was used in a helium atmosphere for measuring the resistivities and Seebeck coefficients in the direction parallel to the surface of the sheet. The temperature gradient and heating rate between hot and cold sides were fixed at 50 K and 5 K/min, respectively. The charge carrier concentration and Hall mobility were measured using HCS 10 system, Linseis. The thermal conductivity was measured using a laser flash thermal conductivity analyzer model LFA-1000, Linseis. It was used to measure the cross plane thermal conductivity in the direction perpendicular to the surface of a sheet.

A single and Unilegs TE modules made of the BMN/SWCNT nanocomposite sheet in a rectangular form (T×W×L=0.5×12×14 mm) was constructed. The TE leg was mounted on an alumina substrate of a thickness around 1 mm. Silver electrode was used to facilitate the charge transport and to attach both sides of the TE leg to the measurement system. For power output measurement, the desired temperature gradients between the two sides of the rectangular sheet were maintained by using a hot plate in one side. The power generation characteristics of this single-leg module were measured at two different temperatures gradients under real-time conditions in air. The measurements were repeated several times to insure the stability and the reusability of the material.

Physiochemical Characterization

Figure 1B:
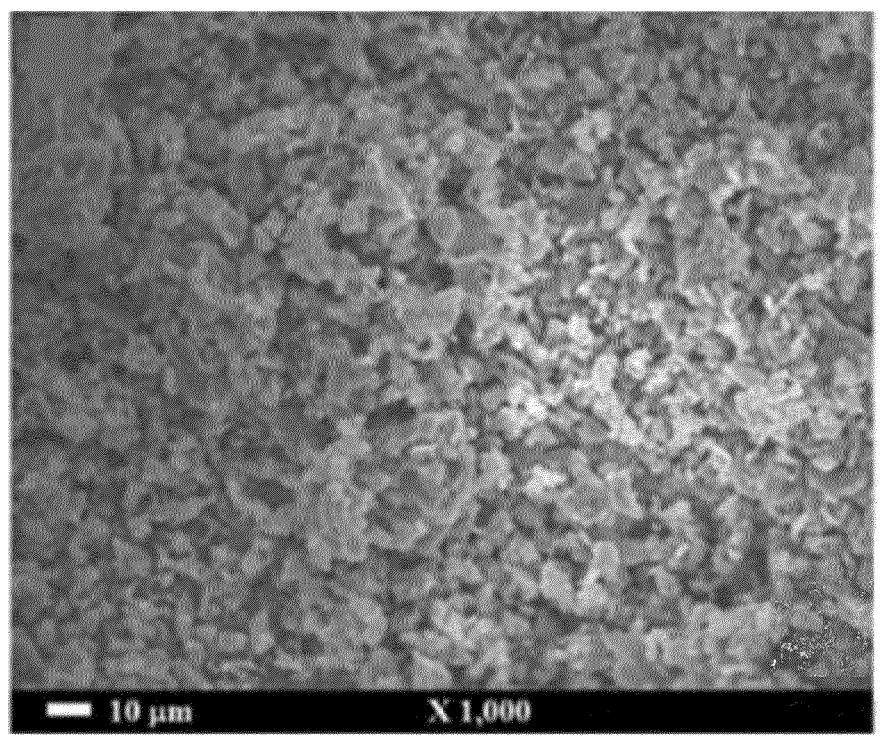
Figure 1C:
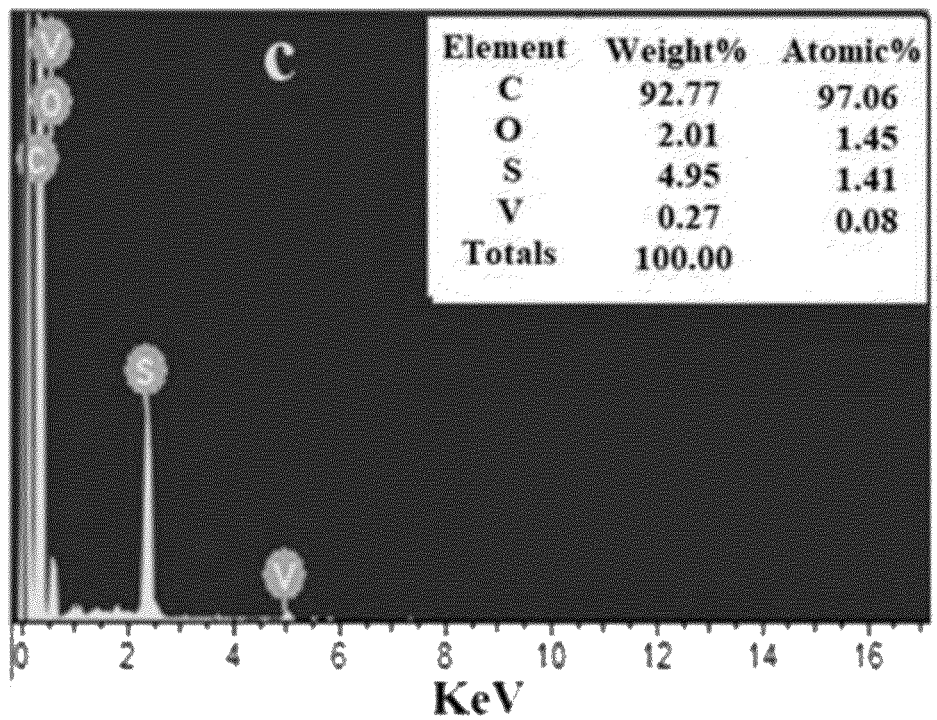
FIG. 1C shows EDS qualitative and quantitative analysis of the purified ball milled oil fly ash powder.

The surface morphology of the used oil fly ash powder was studied using SEM. The SEM image presented in FIG. 1A shows highly porous spherical particles with sizes within the range 10-100 μm. This result is similar to those reported earlier [Numan Salah, et. al., Methods, 2022, 199, 37-53, incorporated herein by reference in its entirety]. These spherical micron sized particles were crushed by the high energy ball milling system into smaller particles/fragments with sizes smaller than 1 μm. The SEM image shown in FIG. 1B shows these sub-micron sized particles, and some of them have nanosized structures as observed previously [Salah, N., et. al., Carbon Lett., 2016, 19, 23-31 and Abdullah Algarni, et. al., Journal of Composite Materials, 2017, 51, 2675-2685, each of which is incorporated herein by reference in its entirety]. The elemental analysis was also performed for the purified ball milled sample using the energy dispersive spectroscopy technique (EDS). The obtained EDS qualitative and quantitative analysis is shown in FIG. 1C, which reveals that carbon is the major elements with around 97 atomic %. Oxygen, sulfur and vanadium are the major remaining elements.

The Raman spectrum of the purified ball milled sample (FIG. 1D) shows clearly that this material has a considerable amount of graphitic content. The graphite in-plane vibration (G) and disorder-induced vibration (D) bands are observed at ~1580 and 1350 cm$^{-1}$, respectively, in this spectrum. The G band is a clear indication that carbon of the purified, ball milled fly ash predominantly exists in graphitic form. This band is normally considered as a good representation of the sp$^2$ bonded carbon that is present in planar sheet configurations.

Figure 1D:
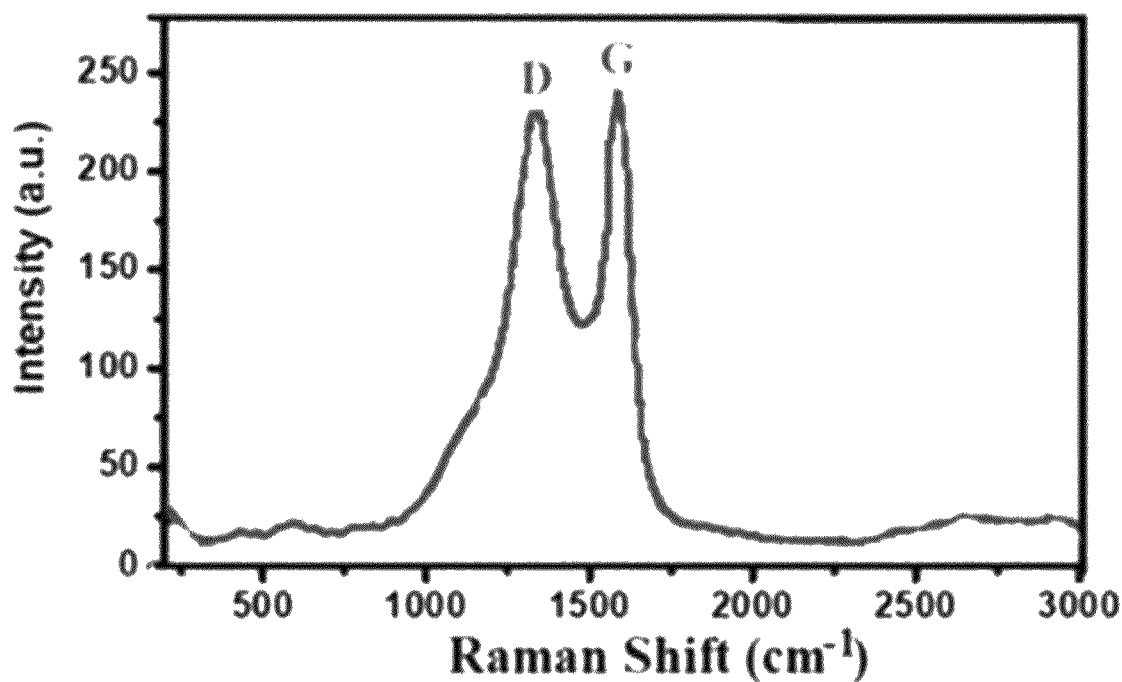
FIG. 1D shows the Raman spectrum of the purified ball milled oil fly ash powder.
Figure 1E:
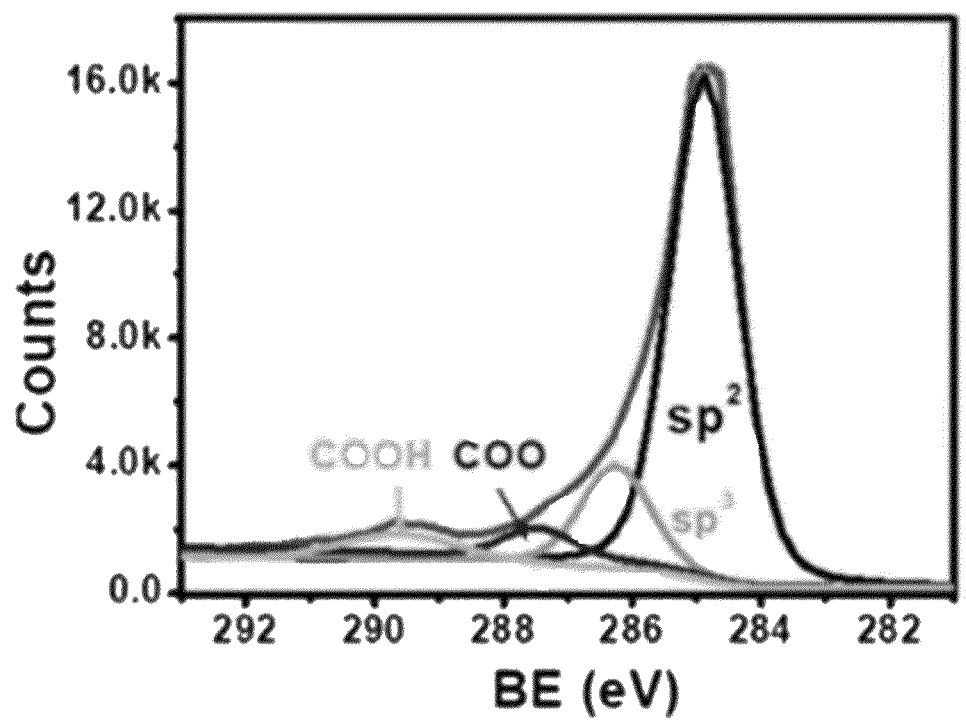
FIG. 1E shows a narrow XPS scan of the C1s band of the carbon material present in the purified ball milled oil fly ash powder.

FIG. 1E shows the XPS narrow scan of the C1s band, which show the presence of the peaks of sp$^2$ and sp$^3$ carbons. The intensity of the sp$^2$ carbon peak is more than three times stronger than that of the sp$^3$ carbon, indicating that the majority of this purified, ball milled fly ash carbon is graphitic. This result is consistent with the above result of Raman (FIG. 1d) and also a confirmation to that reported earlier [Numan Salah, et. al., Methods, 2022, 199, 37-53]. The two small bands located at around 287.7 and 288.8 eV were reported to be of carboxyls, carboxylic anhydrides, and esters (COO) and COOH functional groups [Salah, N., et. al., Mater. Manuf. Processes, 2016, 31, 146-156, incorporated herein by reference in its entirety]. The latter is of π-π* transition carbon (shakeup carbon in aromatic compounds). The presence of these bands might be due the oil residue inside the used oil fly that might still contains some traces of hydrocarbons.

Figure 2A:
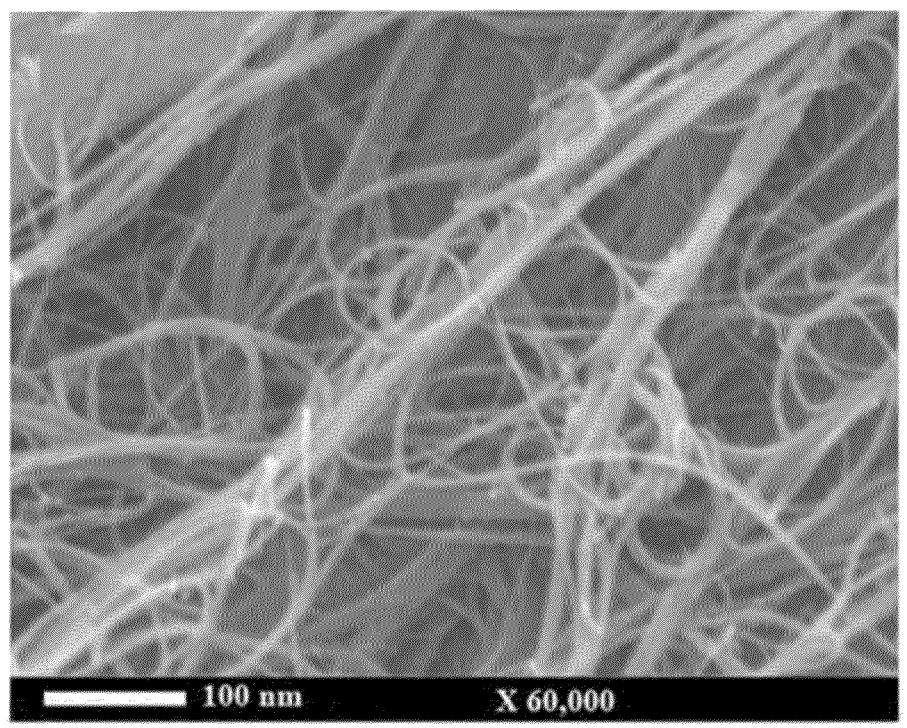
FIG. 2A shows a SEM image of the as received SWCNT.
Figure 2B:
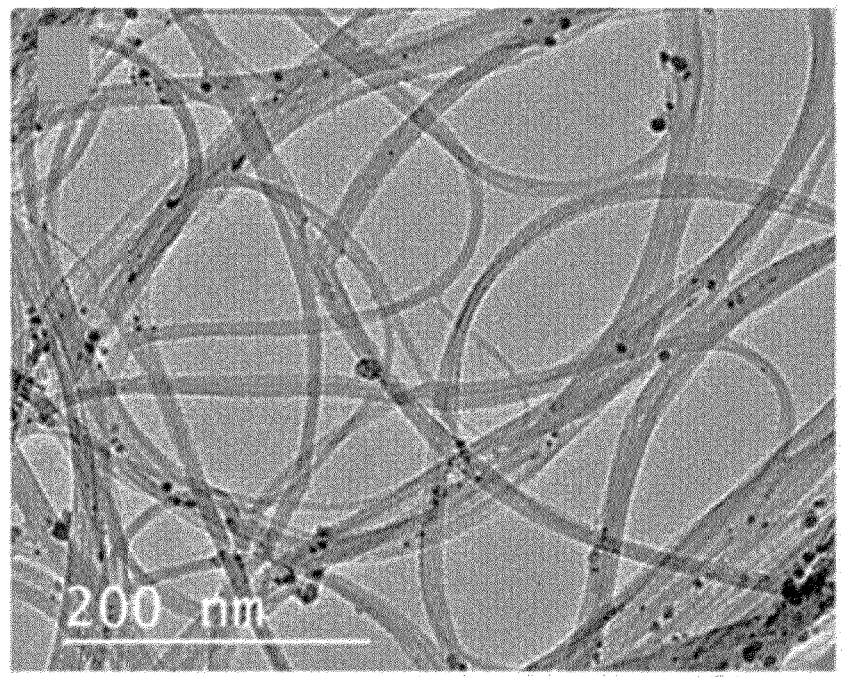
FIG. 2B shows a TEM image of the as received SWCNT.

In FIGS. 2A-2B SEM and TEM images of the as received SWCNT used in this work are shown. These nanotubes are existing in a rope like structures, which contains a number of individual SWCNT. The diameter of these nanotubes is less than 10 nm, as also observed earlier [M. Almasoudi, et. al., Nanomaterials, 2022, 12, 2582, incorporated herein by reference in its entirety]. Some big bundles of these SWCNT containing large number of nanotubes were also observed.

Figure 2C:
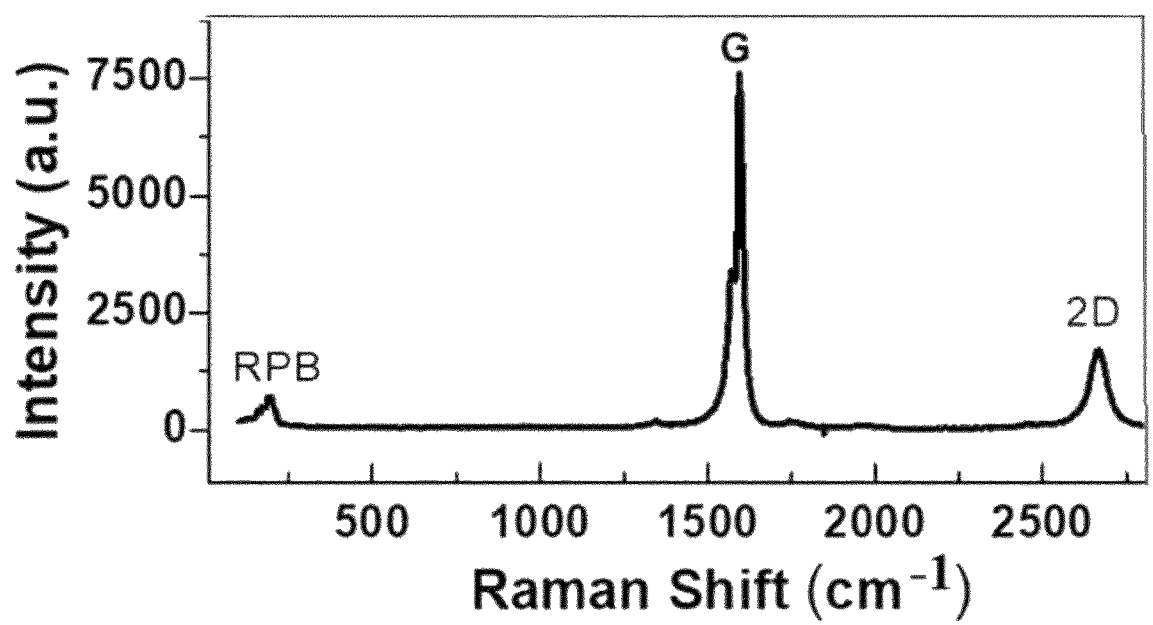
FIG. 2C shows the Raman spectrum (c) of the as received SWCNT.

The Raman spectrum of these SWCNT were also recorded and the result is shown in FIG. 2C. It shows the graphite (G) band clearly at ~1592 cm$^{-1}$ along with small hump of the defect (D) band at ~1344 cm$^{-1}$ in this spectrum. Another band is located at around 2700 cm$^{-1}$, which is an overtone mode of the D-band and called 2D-band. Smaller band at around 142 cm$^{-1}$ is observed in this spectrum, which is the RPM breathing mode of SWCNT [Numan Salah, et. al, Diamond & Related Materials, 2017, 78, 97-104, incorporated herein by reference in its entirety]. This spectrum clearly confirmed the regular structure of the used SWCNT.

Figure 3A:
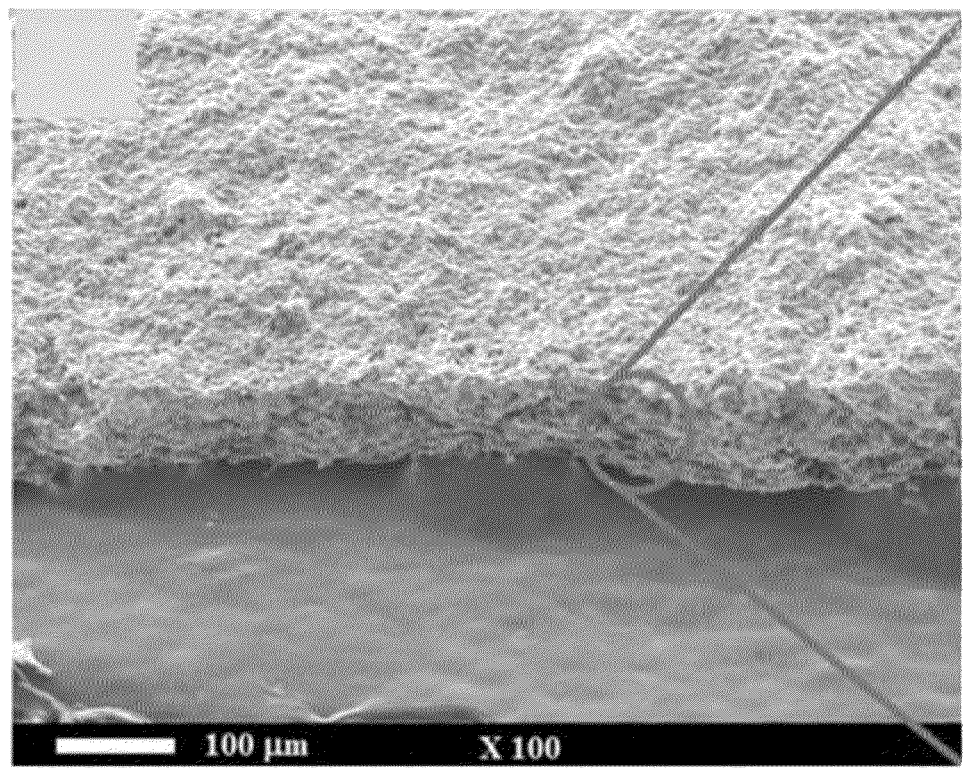
FIGS. 3A-3D show various characterizations of a BMN/SWCNT nanocomposite sheet having a typical composition of BMN:PMMA:SWCNT=0.375 gm:0.025 gm:0.016 gm where
Figure 3B:
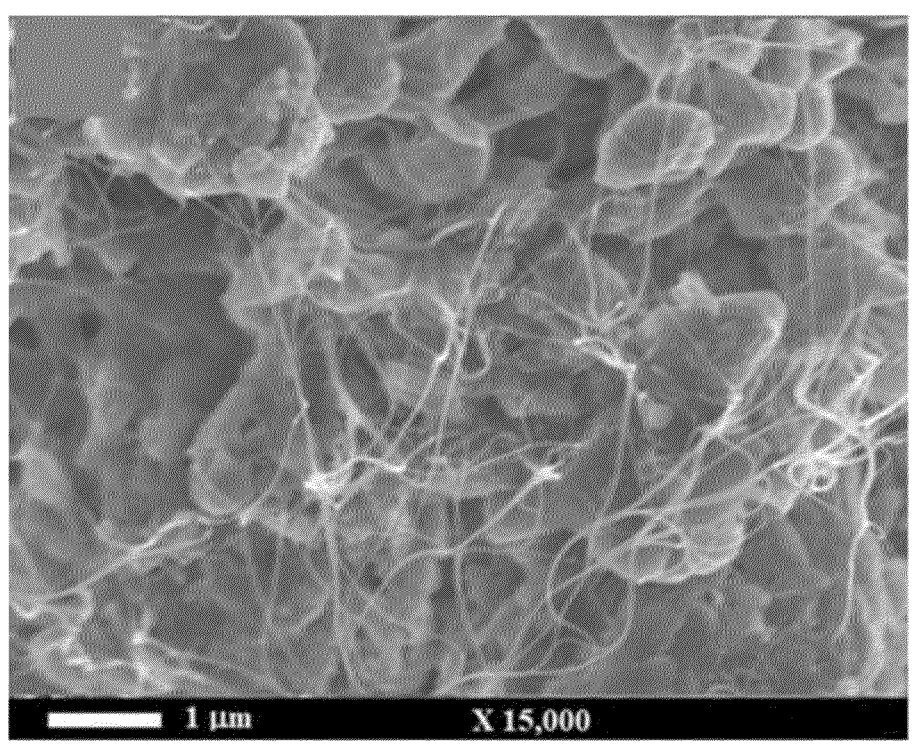

The formed BMN/SWCNT nanocomposite sheet at a typical composition of BMN:PMMA:SWCNT=0.375 gm:0.025 gm:0.016 gm was studied for its surface morphology by SEM technique. The obtained images are shown in FIGS. 3A-3B. The low magnification SEM image presented in FIG. 3A shows a top and cross section views of the formed sheet with a thickness of around 100 μm. Another SEM image of higher magnification shown in FIG. 3B displays well connected BMN particles with SWCNT. These SWCNT were added to enhance both the electrical conductivity and mechanical properties of the nanocomposite sheet. They could form very excellent net of SWCNT in the whole matrix of the sheet, that might facilitate the charge transport.

Figure 3C:
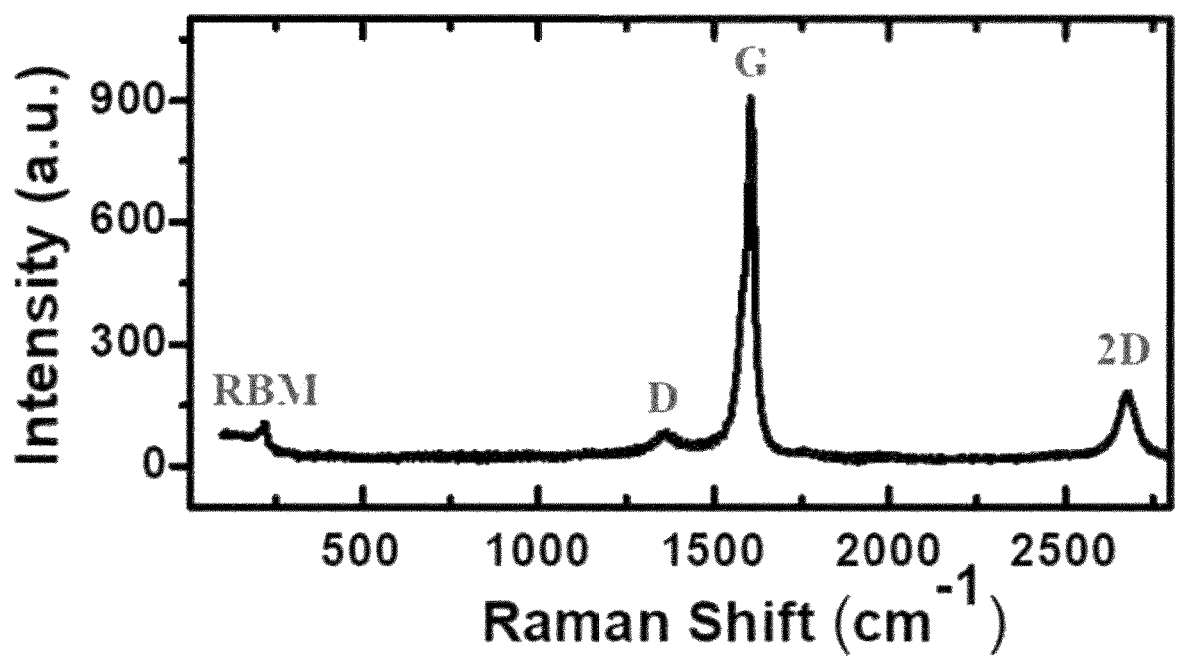

The Raman spectrum of the formed BMN/SWCNT nanocomposite sheet at a typical composition of BMN:PMMA:SWCNT=0.375 gm:0.025 gm:0.016 gm is shown in FIG. 3C. It shows the G band at ~1592 $cm^{-1}$ along with small hump of the D band at ~1344 $cm^{-1}$ in this spectrum. Another band is located at around 2700 $cm^{-1}$, which is an overtone mode of the D-band and called 2D-band. Smaller band at around 142 $cm^{-1}$ is observed in this spectrum, which is the RPM breathing mode of SWCNT as described above. This spectrum is almost similar to that of pure SWCNT, shown above in FIG. 2C, with only a decrease in the band's intensities. The bands of BMN are not shown in the BMN/SWCNT nanocomposite as their spectrum is much weaker than that of SWCNT. Moreover, the bands of BMN are more or less overlapping those of SWCNT.

Figure 3D:
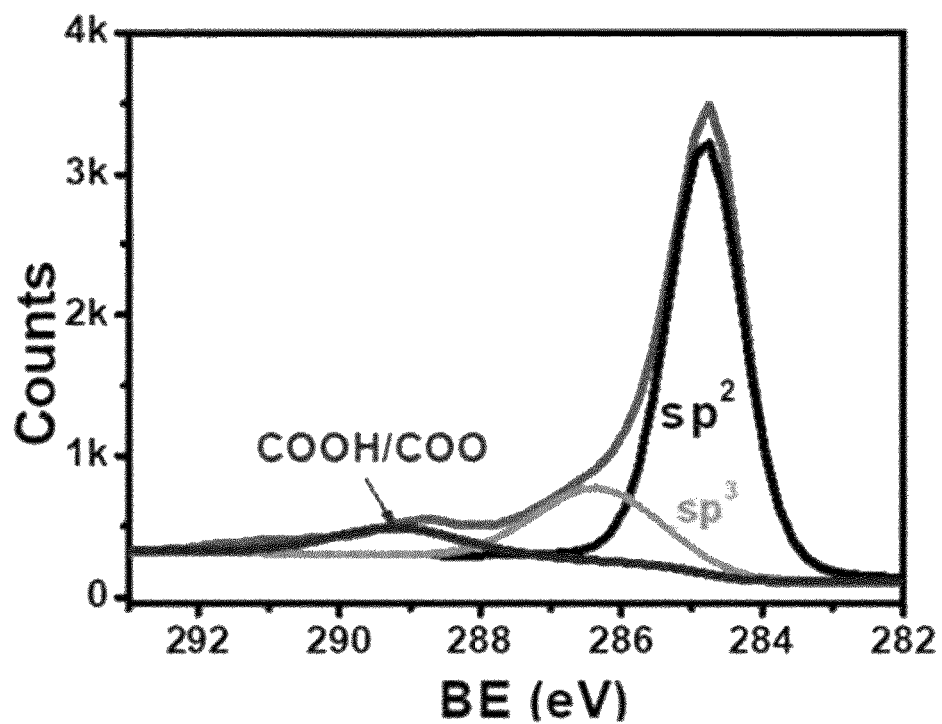

The XPS spectrum of the deconvoluted CIs band presented in this nanocomposite is in FIG. 3D. The narrow scan of CIs shows the peaks of $sp^2$ and $sp^3$ carbons. The intensity of the $sp^2$ carbon peak is around three times stronger than that of the $sp^3$ carbon. The small band located at around 286.6 eV might be of COO functional groups.

Figure 4:
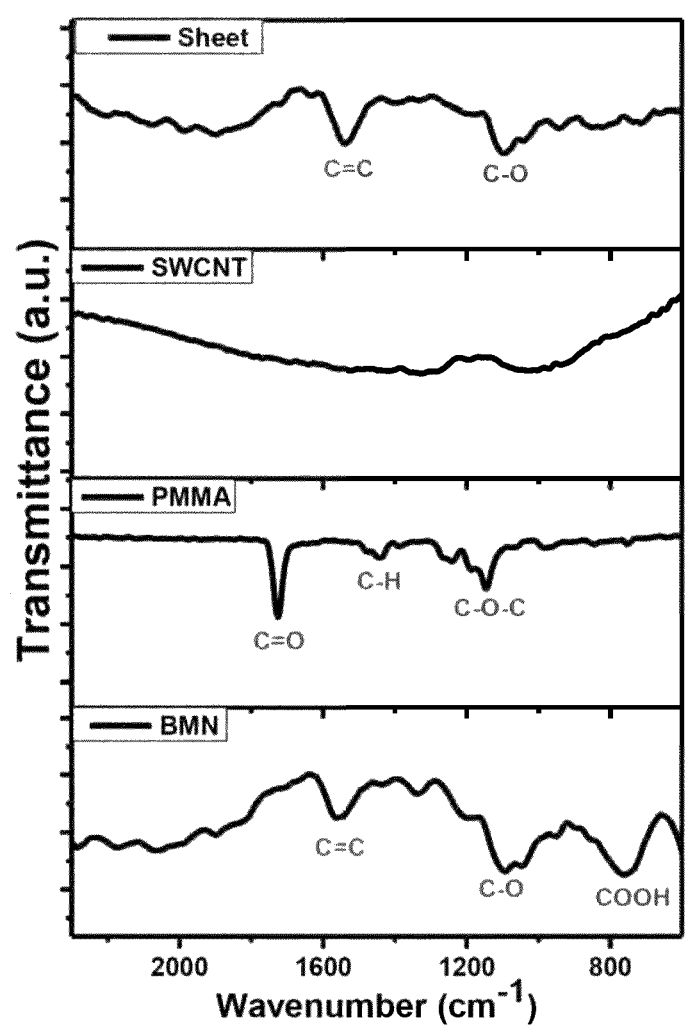
FIG. 4 shows the FTIR spectra of the fabricated BMN/SWCNT nanocomposite sheet at a typical composition (BMN:PMMA:SWCNT=0.375 gm:0.025 gm:0.016 gm) as well as spectra of the individual component materials (BMN, PMMA and SWCNT).

FIG. 4 shows the FTIR spectrum of the fabricated BMN/SWCNT nanocomposite sheet at a typical composition (BMN:PMMA:SWCNT=0.375 gm:0.025 gm:0.016 gm). Spectra of the individual materials are also shown (BMN, PMMA and SWCNT). The nanocomposite sheet of BMN/SWCNT has several bands peaking at 715, 827, 945, 1100, and 1550 $cm^{-1}$. Most of these bands are very small, except two prominent signals. The most intense bands are located at 1100, and 1550 $cm^{-1}$, which are of C—O stretching, and of aromatic C=C ring stretching, respectively [Caroline D. Zappielo, et. al., J. Braz. Chem. Soc., 2016, Vol. 27, No. 10, 1715-1726; and C. Saka, Journal of Analytical and Applied Pyrolysis, 2012, 95, 21-24, each of which is incorporated herein by reference in its entirety]. In case of BMN its spectrum contains small and big bands. The most prominent signals are located at 760 $cm^{-1}$ corresponding to COOH group, 1090 $cm^{-1}$ of C—O stretching, and 1550 $cm^{-1}$ of C=C aromatic C=C ring stretching [Satyendra K. Mishra, et. al., Plasmonics, 2015, 10, 1147-1157, incorporated herein by reference in its entirety]. The binder PMMA is well known to have several bands, mostly within the range 1000-2000 $cm^{-1}$ [Fliavio James Tommasini, et. al., Materials Research, 2018, 21, 6, e20180086, incorporated herein by reference in its entirety]. The first prominent one is located at 1146-1255 $cm^{-1}$, which can be assigned to the C—O—C stretching vibration, while the second band is peaking at 1443 $cm^{-1}$ and attributed to bending vibration of the C—H bonds of the —$CH_3$ group [Olga Pinheiro Garcia, et. al., Materials Research, 2015, 18, 2, 365-372, incorporated herein by reference in its entirety]. The third band is located at 1725 $cm^{-1}$; it is sharp and has high intensity, which is due to the stretching of carbonyl group, C=O. These spectra showed that the reaction between BMN, which has a COOH group and PMMA revealed a reduction in intensity of the COOH band confirming chemical bonding between BMN and PMMA. This is a clear indication for the COOH linkage in the BMN/SWCNT nanocomposite sheet.

Thermoelectric Characterization

Figure 5A:
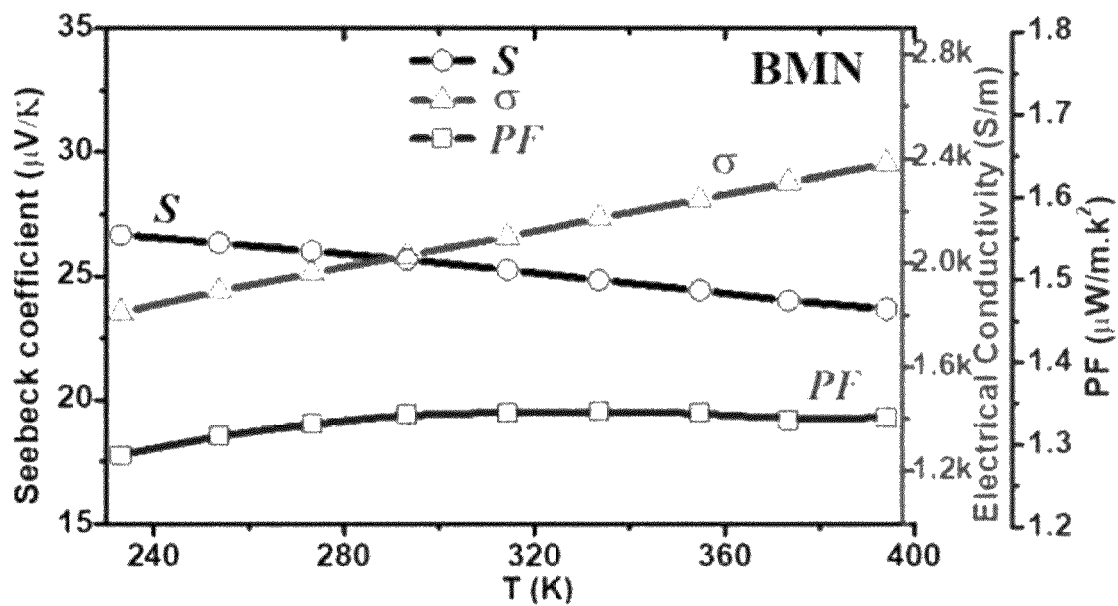
FIGS. 5A-5B show plots of properties relevant to TE performance of pure BMN (FIG. 5A) and pure SWCNT (FIG. 5B) formed in pellet forms.
Figure 5B:
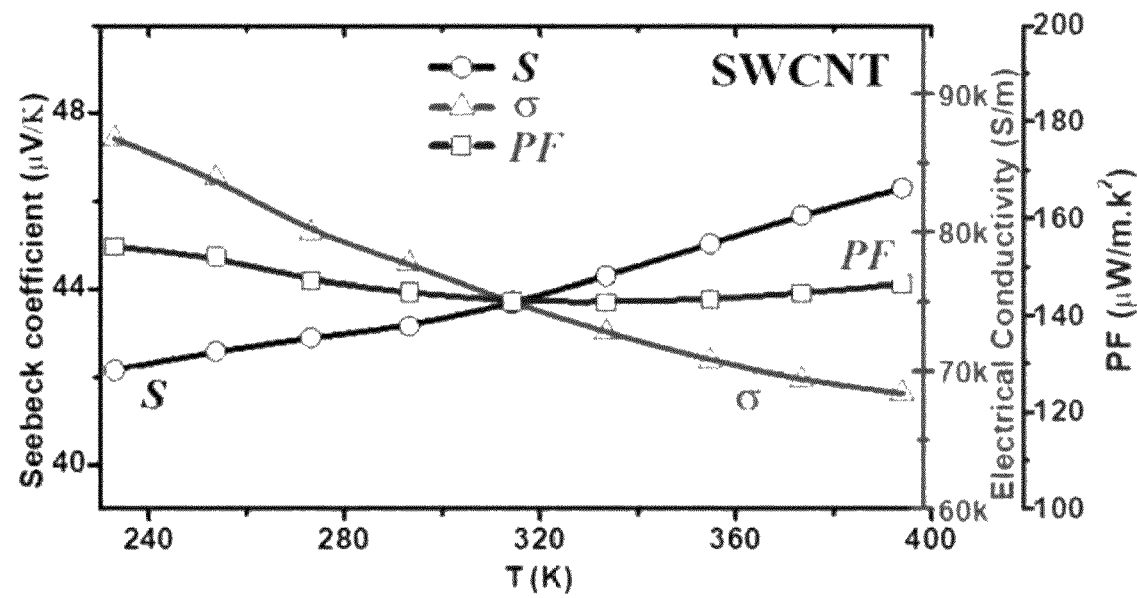

TE performance of the pure BMN and SWCNT formed in compact pellet forms were measured and the obtained results are shown in FIGS. 5A-5B. The TE result of BMN plotted in FIG. 5A. show the electrical conductivity (σ, open triangles), Seebeck coefficient (S, open circles), and power factor (PF, open squares) values as a function of temperature within the range 233-393 K. At 233 K, the electrical conductivity, recorded around 1800 S/m. This value increased by heating and reached to 2400 S/m at 393 K. This behavior is of non-degenerate semiconductors (i.e., change in the electrical conductivity with respect to the change in the temperature is >0) [A. Liu, et. al., Adv. Sci., 2021, 8, 2100546, incorporated herein by reference in its entirety]. This semiconducting property observed in the present BMN material is perhaps induced due to the short-range graphitic content enclosed in its host (as shown in FIGS. 1D and 1E).

The Seebeck coefficient values of the BMN were also plotted as a function of temperature within the same range (e.g. 233-393 K) (FIG. 5A). The obtained values are positive implying that the BMN is a p-type semiconductor. These values were decreased by heating in opposite trend to those of the electrical conductivity. At 233 K the recorded Seebeck value is around 27 μV/K, while by heating to 393 K this value decreased to 24 μV/K. It is remarkable to observe that the recorded values of both the electrical conductivity and Seebeck coefficient are very systematic. By heating there is a negatable fluctuations in these values within the recorded range. The typical morphology of this BMN compact, which include high porosity in the particle surface along with boundary zones located around the graphitic contents might contributed into the observed Seebeck values thought energy filtering effect [X Guan, et. al., CCS Chem, 2021, 3, 2415-2427, incorporated herein by reference in its entirety]. Such highly porous material at the nano and sub-micron scale sizes can enhance the potential barrier against the transported charges, thus increasing the Seebeck coefficient value. The calculated power factor, PF of the BMN compact pellet is shown in FIG. 5A. It recorded around 1.30 μW/m·$K^2$ at 233 K, while by heating it slightly increased to 1.34 μW/m·$K^2$ at 393 K.

The TE performance of the used SWCNT formed in a compact pellet form is shown in FIG. 5B. The obtained result shows that at 233 K the electrical conductivity recorded 87000 S/m, while at 393 K it decreased to 68000 S/m. Although this SWCNT is mostly present in bundle form, it showed high electrical conductivity in its compact form. The observed behavior of the recorded curve is of degenerate semiconductors (i.e., change in the electrical conductivity with respect to the change in the temperature is <0). The Seebeck coefficient (open circles) value of the SWCNT compact pellet is comparable with those reported in the literature [J. L. Blackburn, et. al., Adv. Mater., 2018, 30, 1704386, incorporated herein by reference in its entirety]. Positive values are observed indicating a p-type semiconducting property. At 233K the Seeebeck value is found to be 43 μV/K, while by heating to 393 K it slightly increased to 46 μV/K. The calculated power factor, PF of the SWCNT compact pellet is shown in FIG. 5B. It recorded around 150±5 μW/m·$K^2$ within the recorded temperature range, e.g. 233-393 K. This value is high compared to those reported in J. L. Blackburn, et. al, which is due to the highly electrical conductivity.

To evaluate the TE performance of a designed nanocomposite sheet, the individual components forming this composite were investigated to carefully account for their effect on the TE results. As mentioned above, PMMA was selected as a binder and SWCNT as an enhancer for the electrical conductivity, therefore the needed amounts for a freestanding sheet with a good TE performance should be selected.

Figure 6A:
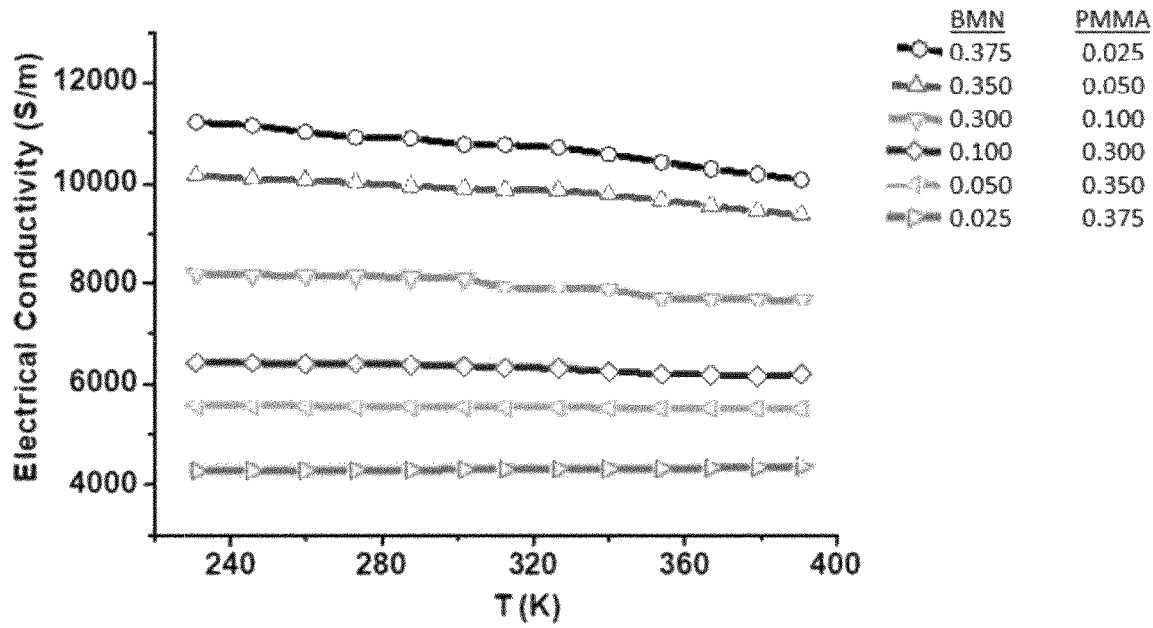
FIGS. 6A-6C show plots of properties relevant to TE performance of BMN/SWCNT nanocomposite sheet fabricated using various ratios of BMN and PMMA at fixed amount of SWCNT (12 mg) where
Figure 6B:
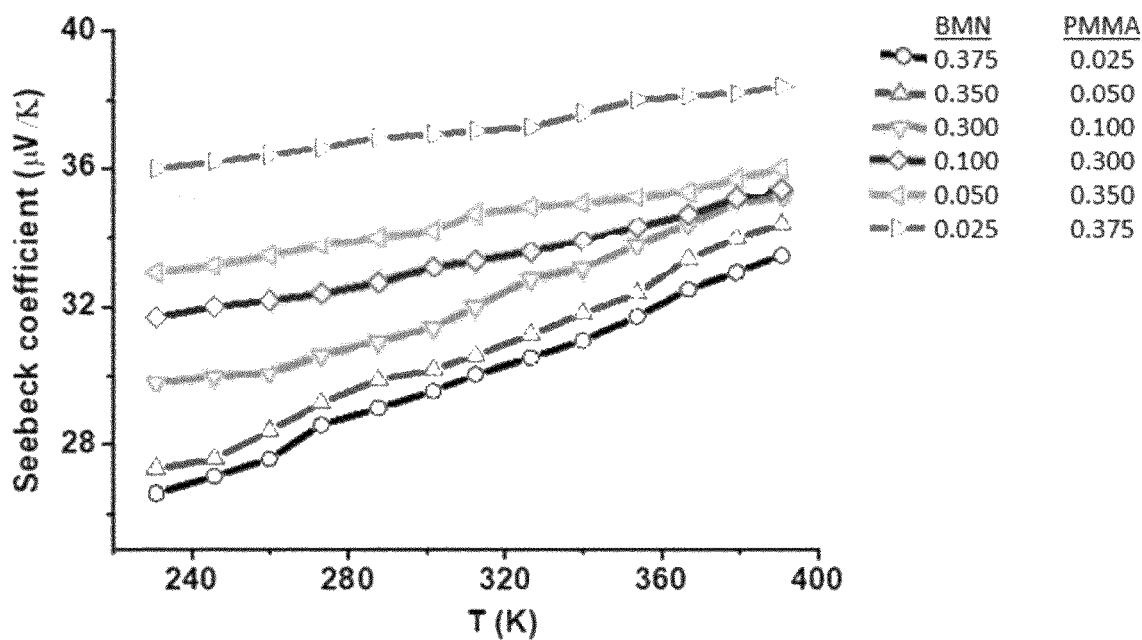
Figure 6C:
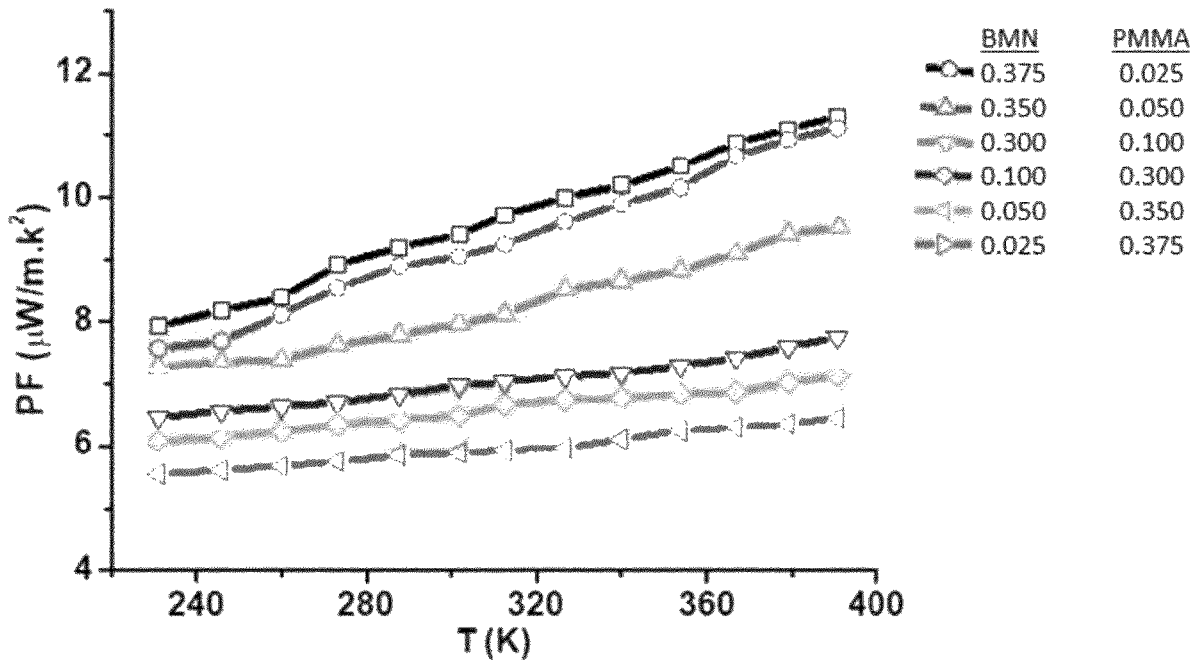

Initially the amount of SWCNT was fixed, while those of BMN and PMMA were varied. In Table 1 the materials compositions at different ratios used to fabricate BMN/SWCNT nanocomposite at a fixed amount of added SWCNT are shown. SWCNT was fixed at 3 wt. % (12 mg), while both BMN and PMMA are vary from 6 wt. % (0.025 mg) to 94 wt. % (0.375 mg) in a vise versa manner. The obtained TE results of BMN/SWCNT nanocomposite sheet are shown in FIGS. 6A-6C. The electrical conductivity, Seebeck coefficient and power factor values were plotted as a function of temperature.

TABLE 1

Materials compositions at different ratio used to fabricate BMN/SWCNT nanocomposite at a fixed amount of SWCNT.

| PMMA (mg) | BMN (mg) | SWCNT (mg) | Chloroform (ml) |
|---|---|---|---|
| 0.375 | 0.025 | 12 | 20 |
| 0.350 | 0.050 | | |
| 0.300 | 0.100 | | |
| 0.100 | 0.300 | | |
| 0.050 | 0.350 | | |
| 0.025 | 0.375 | | |

FIG. 6A shows the electrical conductivity values vs the temperature within the range 233-393 K for the BMN/SWCNT nanocomposites at various amounts of PMMA and BMN as shown in Table 1. When the amount of PMMA was minimum at 25 mg, the electrical conductivity showed its maximum. It recorded 11200 S/m at 233 K and slightly decreased by heating to around 10500 S/m at 393 K. This behavior on decreasing the electrical conductivity is well known to be of degenerated semiconductors, which is useful for TE performance. The electrical conductivity recorded its minimum values when the amount of PMMA was 375 mg. It only recorded around 4300 S/m at 233 K and slightly increased by heating to 4500 S/m at 393 K. This increase by heating is of a non-degenerated meminductors. The other composition values of PMMA and BMN showed intermediated values for the electrical conductivity.

In FIG. 6B, the Seebeck coefficient values of the BMN/SWCNT nanocomposites at various amounts of PMMA and BMN are shown. They also were plotted as a function of temperature within the same range (e.g., 233-393 K). The obtained values showed opposite trends to those of the electrical conductivity. At 233 K the Seebeck values are within the range 26.5-36 µV/K, while by heating to 393 K these values increased to be within the range 32-38 µV/K. The corresponding power factor values of the formed nanocomposite sheets are shown in FIG. 6C. The highest value is found to be of the composition of BMN=375 mg and PMMA=25 mg. This composition recorded a power factor value of 8 µW/m·K$^2$ at 233 K. This value increased by heating and reached to 11.5 µW/m·K$^2$ at 393 K.

Figure 7A:
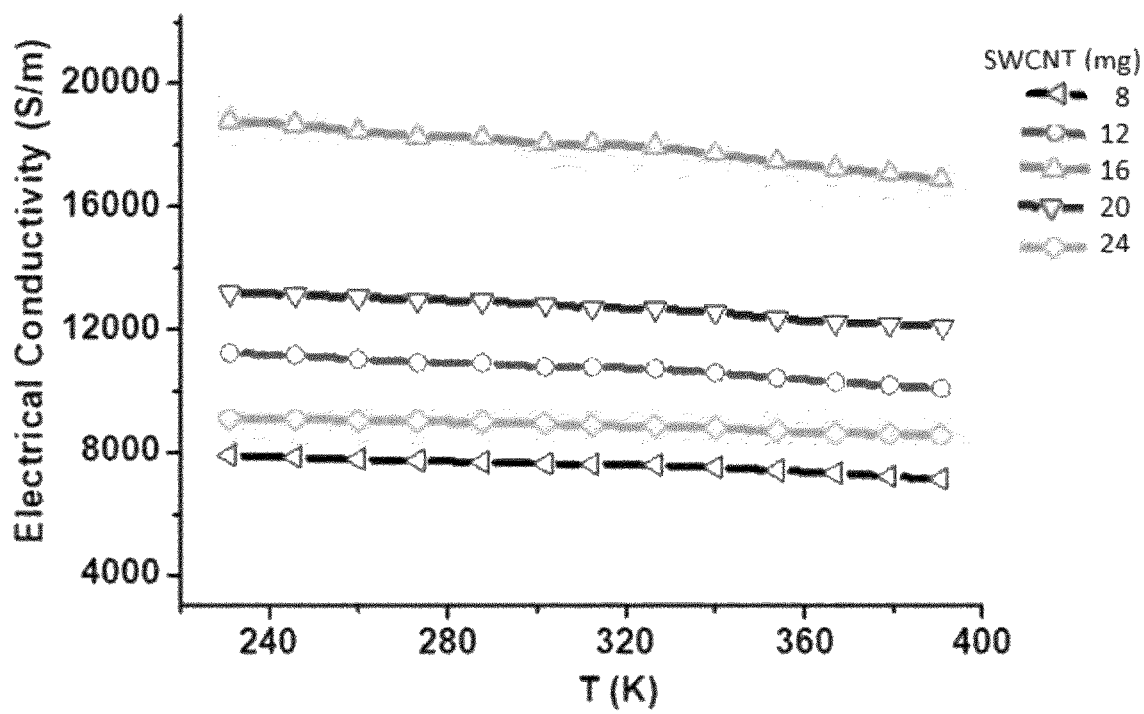
FIGS. 7A-7C show plots of properties relevant to TE performance of BMN/SWCNT nanocomposite (BMN:PMMA=0.375:0.025) at various amounts of SWCNT where
Figure 7B:
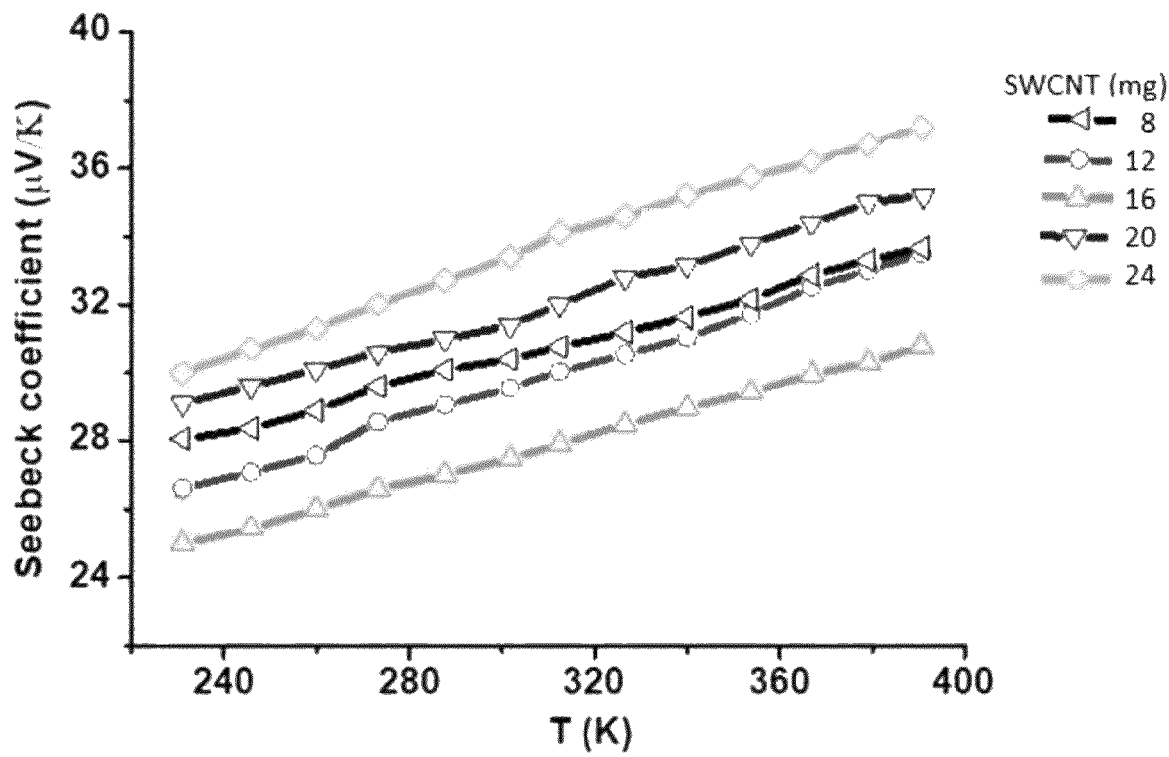
Figure 7C:
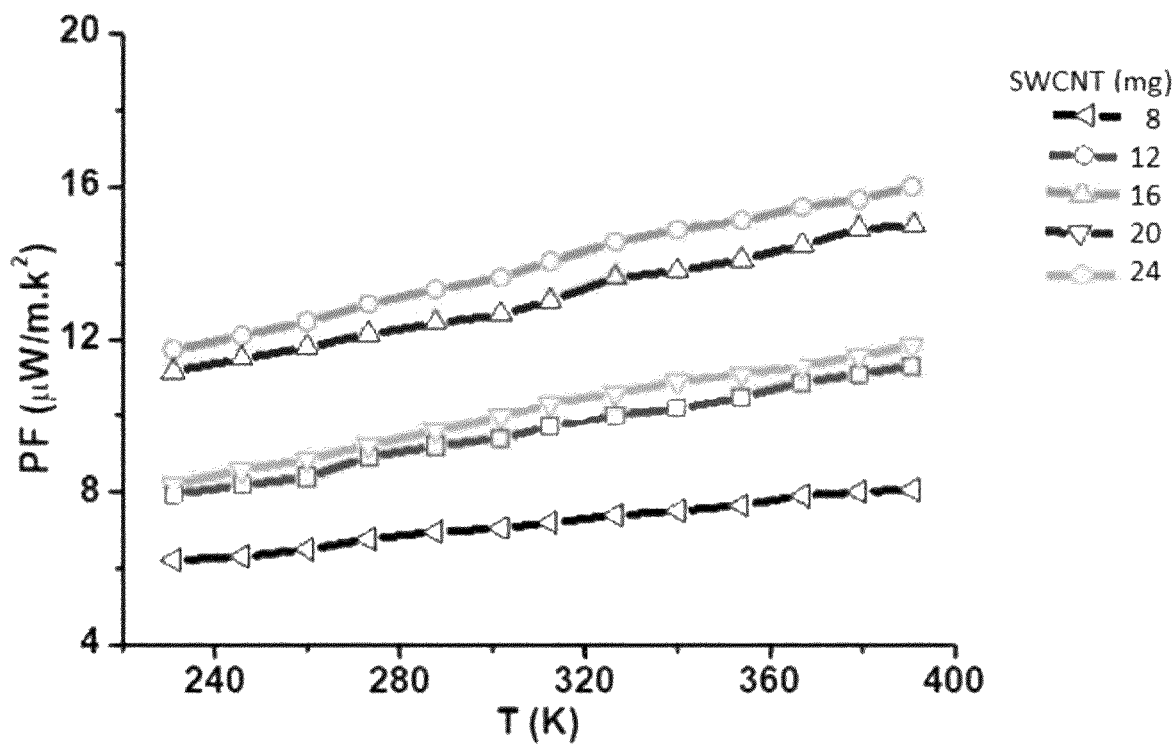

After determining the amounts of BMN and PMMA at a fixed amount of SWCNT for maximum TE performance, the next step is to determine the amount of SWCNT. In Table 2. The best amounts of BMN and PMMA, which are 0.375 mg and 0.025 mg, respectively, where fixed while that of the SWCNT vary within the range 8-24 mg (2-6 wt. %). The TE performance is shown in FIGS. 7A-7C. The best concentration of SWCNT for maximum electrical conductivity is found to be 4 wt. % (16 mg). This concentration has increased the electrical conductivity to 19000 S/m at 233 K (FIG. 7A), but slightly decreased it to around 17500 S/m by heating up to 393 K. The other concentrations of SWCNT, which are either lower or higher than 16 mg provided smaller electrical conductivity. Small concentrations might not be enough to connect all parts of the BMN matrix, while higher concentrations of SWCNT perhaps overlapped then reduced the charge mobility. With the observed improvement in the electrical conductivity at the best concentration of SWCNT (FIG. 7A), there is a slight decrease in the Seebeck values as shown in FIG. 7B. Nevertheless, the power factor values showed significant enhancements, particularly at SWCNT concentration of 4 wt. % (16 mg). At 233 K the calculated value is 12 µW/m·K$^2$, while by heating the sample to 393 K, the power factor value reached 16 µW/m·K$^2$.

TABLE 2

Materials compositions used to fabricate BMN/SWCNT nanocomposite sheet at various amounts of SWCNT. The amounts of BMN and PMMA were fixed at 0.375 mg and 0.025 mg, respectively.

| PMMA (gm) | BMN (gm) | SWCNT (mg) | Chloroform |
|---|---|---|---|
| 0.025 | 0.375 | 8 | 20 |
| | | 12 | |
| | | 16 | |
| | | 20 | |
| | | 24 | |

Figure 8:
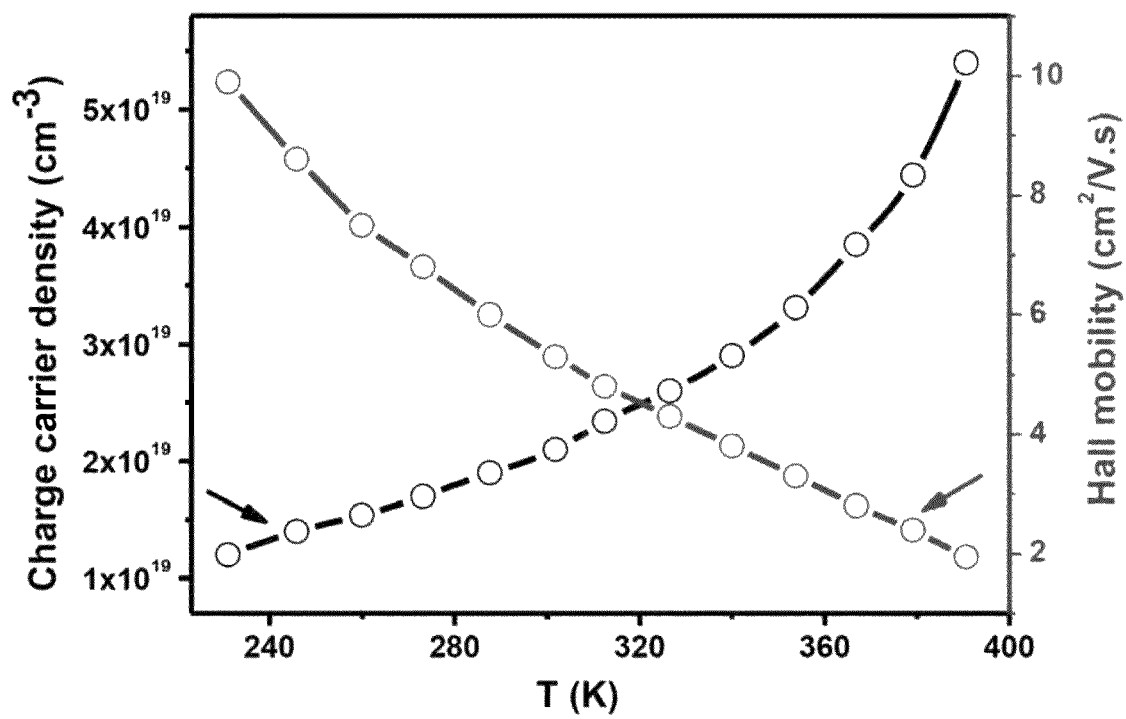
FIG. 8 shows plots of charge carrier density and Hall mobility versus temperature of the BMN/SWCNT nanocomposite sheet.

To understand the electrical conductivity behavior in the BMN/SWCNT nanocomposite sheet of the 4 wt. % SWCNT, the charge carrier density and Hall mobility versus temperature were investigated. They were recorded in the temperature range 233-393 K and the obtained results are presented in FIG. 8. At 233 K the charge carrier density value was found to be around 1.2×10$^{19}$ cm$^{-1}$, while by heating to 393 K this value increased to 5.4×10$^{19}$ cm$^{-1}$. The Hall mobility in the BMN/SWCNT nanocomposite sheet showed opposite trend to that of the charge carrier density. It decreased by heating from 10 cm$^2$/V·s at 233K to approximately 2 cm$^2$/V·s at 393 K. It is clear that below 320 K, both the charge carrier density and the Hall mobility of the BMN/SWCNT nanocomposite sheet still have high values to be recommended as a good TE material with attractive TE performance at RT. Above 320 K, the Hall mobility significantly reduced, which might not be enough to provide good TE performance. Although the results presented in FIG. 7C showed increasing trend for the power factor by heating, but this increase might be associated with an increases in the thermal conductivity, which finally will limit the increases in ZT of the material.

The thermal conductivity of the BMN/SWCNT nanocomposite sheet were measured within the temperature range 293-393 K. The thermal conductivity values of the pure BMN sample in pressed pellet form was also measured in the same temperature range. The obtained results are shown in Table 3. This table also shows the specific heat (Cp), density, and thermal diffusivity values of these samples. At 293 K, the PMN had a thermal conductivity of around 0.314 W/mK, while by heating to 393 K, this value increased to 0.616 W/mK. Surpassingly the thermal conductivity of the BMN/SWCNT nanocomposite sheet was found to be much smaller than that of the pure BMN. At 293 K, the sheet had a thermal conductivity of around 0.174 W/mK, while by heating to 393 K, this value increased to 0.326 W/mK. This is a remarkable result for this new TE material for its application. The SWCNT might induced extra phonon scattering sites, most probably at the interfacing zones. Additionally, as shown in FIG. 3B the SWCNT formed a net inside the BMN in a random manner, which might further facilitate more phonon scattering.

TABLE 3

Thermal conductivity of the BMN/SWCNT nanocomposite sheet. The Thermal conductivity values of the pure BMN sample in pressed pellet form is also shown for comparison. The specific heat (Cp), density, and thermal diffusivity values are shown in this table.

| Sample | Temp. (K) | $C_p$ (J/gK) | Density (g/cm³) | Th. diff. (cm²/s) | Th. Cond. (W/mK) |
|---|---|---|---|---|---|
| Pure BMN | 293 | 0.325 | 0.695 | 0.0140 | 0.314 |
|  | 313 | 0.332 |  | 0.0160 | 0.369 |
|  | 333 | 0.341 |  | 0.0175 | 0.415 |
|  | 353 | 0.373 |  | 0.0190 | 0.492 |
|  | 373 | 0.401 |  | 0.0203 | 0.565 |
|  | 393 | 0.424 |  | 0.0201 | 0.616 |
| BMN/SWCNT nanocomposite sheet | 293 | 0.364 | 0.550 | 0.0087 | 0.174 |
|  | 313 | 0.388 |  | 0.0106 | 0.226 |
|  | 333 | 0.401 |  | 0.0118 | 0.260 |
|  | 353 | 0.412 |  | 0.0127 | 0.288 |
|  | 373 | 0.417 |  | 0.0135 | 0.305 |
|  | 393 | 0.424 |  | 0.0140 | 0.326 |

Figure 9:
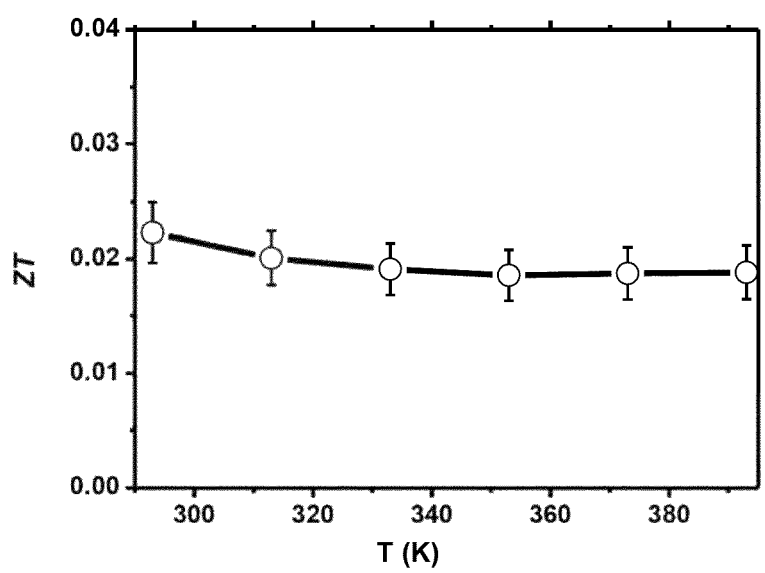
FIG. 9 shows a plot of thermoelectric figure of merit (ZT) versus temperature of a BMN/SWCNT nanocomposite sheet.

After determining the thermal conductivity of the BMN/SWCNT nanocomposite sheet, the thermoelectric figure of merit, ZT values were calculated and plotted versus temperature. The obtained results are presented in FIG. 9. At 293 K the ZT value is found to be around 0.022, while by heating this value is slightly decreased to around 0.020. This decreases by heating was due to the increase in the thermal conductivity as shown in Table 3. Nevertheless, this nanocomposite seems to have better TE features than similar composites described in the literature. Table 4 shows clearly the TE performance of the present BMN/SWCNT nanocomposite sheet at RT in comparison with different composites fabricated from carbon nanomaterials and polymers including some common thermoplastics. Both the power factor and ZT values are higher than those nanocomposites. This good result obtained at just RT is much better than the reported results on some of those materials that recorded their TE performance at higher temperatures.

TABLE 4

Thermoelectric performance of the present BMN/SWCNT nanocomposite sheet in comparison with different composites fabricated from carbon nanomaterials and polymers including some common thermoplastics.

| Nanocomposite materials | σ (S/m) | S (µV/K) | P.F. (µW/m·K²) | zT | Ref. |
|---|---|---|---|---|---|
| BMN/SWCNT (at RT) | 18000 | 27 | 14 | $22 \times 10^{-3}$ | This work |
| MWCNTs/PPy | 4000 | ~14 | 0.77 | $1 \times 10^{-3}$ | [1] |
| PPy + MWNT | 7200 | 8 | 2 | — | [2] |
| PPy nanowire/rGO | 7500.1 | 33.8 | 8.56 | — | [3] |
| PPy/rGO | 4160 | 26.9 | 3.01 | — | [4] |
| PPy/GNs(PPy/graphene nanosheets) | 10168 | 31.74 | 10.24 | $2.8 \times 10^{-3}$ | [5] |
| PPy/rGO thin film | 8000 | 29 | 7.28 | — | [6] |
| PPy/MWCNT (20 wt %) | ~3150 | ~25.4 | 2.08 | — | [7] |
| PPy/MWCNT (68 wt %) (at RT) | 3670 | 24.5 | 2.2 | — | [8] |
| PPy/graphene (20 wt %) (at 380 K) | 3690 | 16.6 | 1.01 | — | [9] |
| SWCNT/PPy (40 wt %) (at 398 K) | 10699 | 22.59 | 5.46 | — | [10] |
| PP + SWCNT | 62. | 64 | 0.26 | — | [11] |
| PP + SWCNT + CuO | 0.38 | 45 | $7.7 \times 10^{-4}$ | — | [12] |
| PP + SWCNT + Polyoxyethylene | 6200 | −56.6 | — | — | [13] |
| PP + CNT + CuO | 0.38 | 45 | $9.6 \times 10^{-4}$ | — | [14] |
| PP + PC, PVDF, and PBT or PA66, PA6, PARA + ABS + SWCNT | 7210 | 66.4 | 0.28 | $3.1 \times 10^{-4}$ | [15] |
| PP + N-MWCNTs | 10000 | −22.8 | $6.1 \times 10^{-3}$ | — | [16] |
| PP + SWCNTs + B-SWCNTs | 2200 | 59.7 | 0.78 | $8.9 \times 10^{-6}$ | [17] |
| PC/MWCNT-COOH/CBT | 5 | 13.55 | $7.60 \times 10^{-6}$ | $7.94 \times 10^{-9}$ | [18] |
| PC + MWCNT, (—COOH) and (—OH) MWCNTs | 1 | 11.3 | $10^{-10}$ | $10^{-6}$ | [19] |
| PVDF + MWCNTs and GNPs | $1 \times 10^{-2}$ | 58 | — | — | [20] |
| CNF + PP | 11.2 | −8.5 | $1.75 \times 10^{-3}$ | $1.2 \times 10^{-6}$ | [21] |
| PCTFE + Cu₂O/graphite | $10^{-2}$ to 1 | 127 | $2.75 \times 10^{-5}$ | — | [22] |
| UHMWPE + CNTs and Bi₂Te₃ | 4500 | 29 | — | $3 \times 10^{-5}$ | [23] |
| PANi + MWNTs | — | — | 1.25 | — | [24] |
| PA12 + MWCNTs + CB | 27820 | 8.9 | 0.02 | — | [25] |
| PC + SWCNT | — | — | 4.8 ± 0.8 | — | [26] |
| PVAc + CNTs | 4800 | 40-50 | — | 0.006 | [27] |
| PVAc + SWNT-GA | 940 | 40 | — | — | [28] |
| PVAc + MWNT-TCPP | 128 | 28 | 0.2-0.4 | — | [29] |

Abbreviations in Table 4:
Multi-walled carbon nanotubes (MWCNT),
reduced graphene oxide (rGO),
Carbon nanofiber (CNF),
Polypyrrole (PPy),
Polyaniline (PANi),,
Polypropylene (PP),
Plycarbonate (PC),
Poly (vinylidene fluoride) (PVDF),
Poly(butylene terephthalate) (PBT)),
Polyamide 66 (PA66),
Polyamide 6 (PA6),
Polyamide 12 (PA12),
Partially aromatic polyamide (PARA),
Acrylonitrile butadiene styrene (ABS),
Polychlorotrifluoroethene (PCTFE),
ultrahigh molecular weight polyethylene (UHMWPE),
Poly(vinyl acetate) (PVAc),
Meso-tetra(4-carboxyphenyl) porphine (TCPP).

References in Table 4 (each incorporated by reference herein):
[1] Baghdadi, N., et. al., Polymers, 2021, 13, 278.
[2] Liang, L., et. al., Compos. Sci. Technol., 2016, 129, 130-136.
[3] Zhang, Z. et. al., J. Mater. Chem. C., 2015, 3, 1649-1654.
[4] Han, S., et. al., RSC Adv., 2014, 4, 29281-29285.
[5] Wang, L., et. al., RSC Adv. 2014, 4, 46187-46193.
[6] Xin, S., et. al., Mater. Chem. Phys., 2018, 212, 440-445.
[7] Wang J, et. al., Synth. Met., 2014, 195, 132-136.
[8] Song, H., et. al., Synth. Met., 2016, 211, 58-65.
[9] Du Y, et. al., Polymers (Basel), 2018, 10, 1143.
[10] Du, Y., et. al., IOP Conference Series: Earth and Environmental Science. 2018.
[11] J. Luo et. al., AIP Conference Proceedings, 2017, 1914, 1, 30001.
[12] J. Luo, et. al., Polymer (Guildf), 2017, 108, 513-520.
[13] P. Potschke, et. al., AIP Conference Proceedings, 2019, 2055, 1, 90004.
[14] J. Luo, et. al., AIMS Mater. Sci., 2016, 3, 3, 1107-1116.
[15] B. Krause, et. al., J. Compos. Sci., 2019, 3, 4, 106.
[16] B. Krause, et. al., J. Compos. Sci., 2020, 4, 1, 14, 2020.
[17] B. Krause, et. al., Energies, 2020, 13, 2, 394.
[18] L. Tzounis, et. al., Polymer (Guildf), 2014, 55, 21, 5381-5388.
[19] M. Liebscher, et. al., Compos. Sci. Technol., 2014, 101, 133-138.
[20] Y. C. Sun, et. al., Smart Mater. Struct., 2015, 24, 8, 85034.
[21] A. J. Paleo, et. al., Carbon N.Y., 2019, 150, 408-416.
[22] V. Andrei, et. al., Phys. Chem. Chem. Phys., 2016, 18, 16, 10700-10707.
[23] H. Pang, et. al., Mater. Lett., 2013, 107, 150-153.
[24] Y. Zhu, et. al., J. Mater. Chem. A, 2021, 9, 13, 8514-8526.
[25] N. Vidakis, et. al., C Journal of Carbon Research, 2021, 7, 2, 38, 2021.
[26] Y. Zhang, et. al., npj Flex. Electron., 2020, 4, 1, 1-7.

TABLE 4-continued

Thermoelectric performance of the present BMN/SWCNT nanocomposite sheet in comparison with different composites fabricated from carbon nanomaterials and polymers including some common thermoplastics.

| Nanocomposite materials | σ (S/m) | S (μV/K) | P.F. (μW/m·K$^2$) | zT | Ref. |
|---|---|---|---|---|---|

[27] C. Yu, et. al., Nano Lett., 2008, 8, 12, 4428-4432.
[28] Y. S. Kim, et. al., Macromol. Mater. Eng., 2010, 295, 5, 431-436.
[29] G. P. Moriarty, et. al., Carbon N.Y., 2012, 50, 3, 885-895.

Some typical polymer composites showed improved TE performance. Examples of those composites include PEDOT/Te [K. C. See, et. al., Nano Letters, 2010, 10, 4664-4667; N. E. Coates, et. al., Advanced Materials, 2013, 25, 1629-1633; S. Ma, et. al., Applied Physics Letters, 2014, 105 073905; E. J. Bae, et. al., Scientific Reports, 2016, 6, 18805], PANI/Te [Y. Wang, et. al., Journal of Materials Chemistry A, 2016, 4, 3554-3559], PEDOT/Bi$_2$Te$_3$ [B. Zhang, et. al., ACS Applied Materials & Interfaces, 2010, 2, 3170-3178; and Wang L, et. al., Nat Commun, 2018, 9, 3817], PEDOT/MoS2 [F. Jiang, et. al., Journal of Materials Chemistry A, 2016, 4, 5265-5273], PEDOT/Te—Cu1.75Te [E. W. Zaia, et. al., Nano Letters, 2016, 16 3352-3359], PEDOT/SnSe [H. Ju, et. al., ACS Nano, 2016, 10, 5730-5739], PEDOT/Si [D. Lee, et. al., Nanoscale, 2016, 8, 19754-19760], PANI/SWNTs [Q. Yao, et. al., ACS Nano, 2010, 4, 2445-2451; Q. Yao, et. al., Energy & Environmental Science, 2014, 7, 3801-3807; and L. M. Wang, et. al., Chemistry—An Asian Journal, 2016, 11, 1804-1810], PANI/DWNTs [H. Wang, et. al., ACS Applied Materials & Interfaces, 2015, 7, 9589-9597], PANI/graphene [L. Wang, et. al., Journal of Materials Chemistry A, 2014, 2, 11107-11113; and L. Wang, et. al., Journal of Materials Chemistry A, 2015, 3, 7086-7092], PEDOT with SWCNT, DWNT and graphene [C. Yu, et. al., ACS Nano, 2011, 5, 7885-7892; W. Lee, et. al., RSC Advances, 2016, 6, 53339-53344; F. Li, et. al., Synthetic Metals, 2014, 197, 58-61; and D. Yoo, et. al., Nano Research, 2014, 7, 717-730], P3HT/SWNTs [C. Bounioux, et. al., Energy & Environmental Science, 2013, 6, 918-925; and C. T. Hong, et. al., Journal of Materials Chemistry A, 2013, 3, 12314-12319], polystylene/SWNTs [K. Suemori, et. al., Applied Physics Letters, 2015, 106, 113902], PEDOT/graphene/C60 [K. Zhang, et. al., Nano Energy, 20015, 13, 327-335], layer by layer PANI/graphene/PANI/DWNTs [C. Cho, et. al., Advanced Materials, 2015, 27, 2996-3001], layer by layer PANI/graphene/PANI/DWNTs [C. Cho, et. al., Advanced Energy Materials, 2016, 6, 1502168], Layer by Layer PEDOT/PANI [H. J. Lee, et. al., Energy & Environmental Science, 2016, 9, 2806-2811], PEDOT/PEDOT [K. Zhang, et. al., Nanoscale, 2016, 8033-8041], PEDOT/graphene/Te [J. Choi, et. al., Advanced Energy Materials, 2016, 6, 1502181], Ag2Se/PVP [C. Jiang, et. al., Nano Energy, 2021, 80, 105488], TiS$_2$/[(TBA)$_{0.013}$(HA)$_{0.019}$] [C. Wan, et. al., Nat. Commun., 2017, 8, 1024]. The TE performance of these structures is better than those given in Table 4. Some representative PEDOT derivatives have also showed a good TE performance at room temperature [Kyaw A K K, et. al., Macromol. Mater. Eng., 2018, 303, 1-7; and Sun Z, et. al., Polymer, 2020, 192, 122328]. However, in all of these reports no indication about the power output generation from these composites has been described. Moreover, the cost of the used materials, the long processing and scalability are still a big challenge.

Figure 10A:
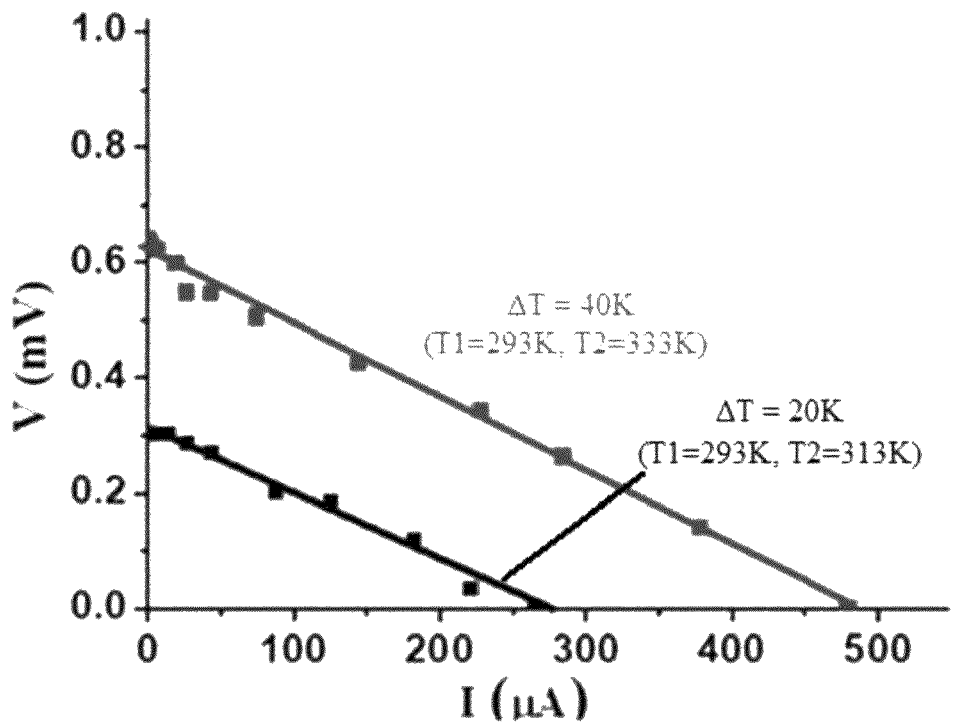
FIGS. 10A-10C show plots of thermoelectric power characteristics of a single leg module made of the BMN/SWCNT nanocomposite sheet at ΔT=20 and 40 K where
Figure 10B:
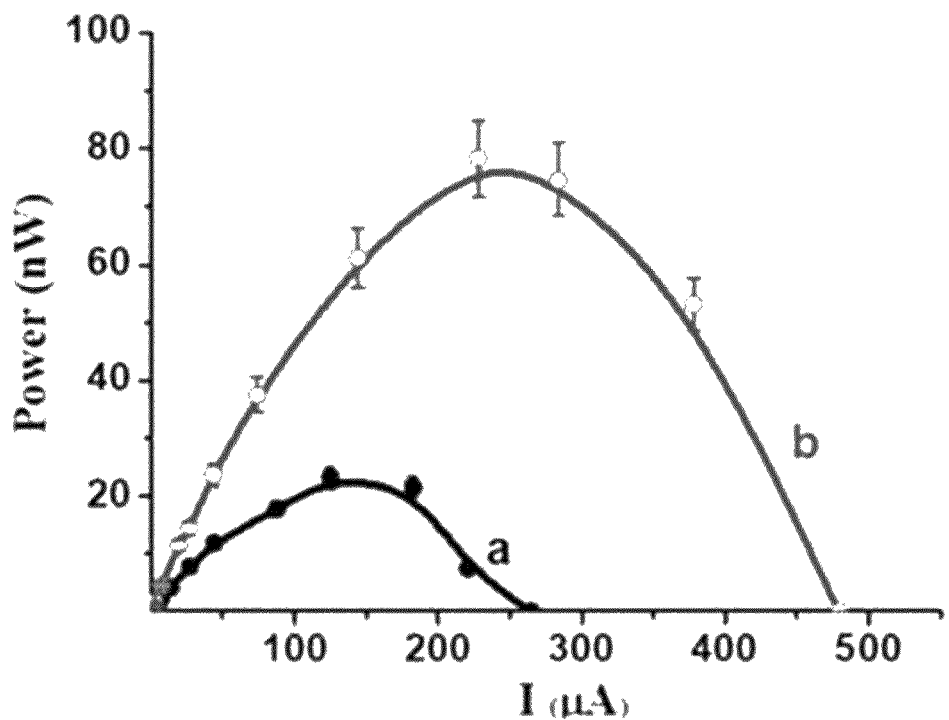
Figure 10C:
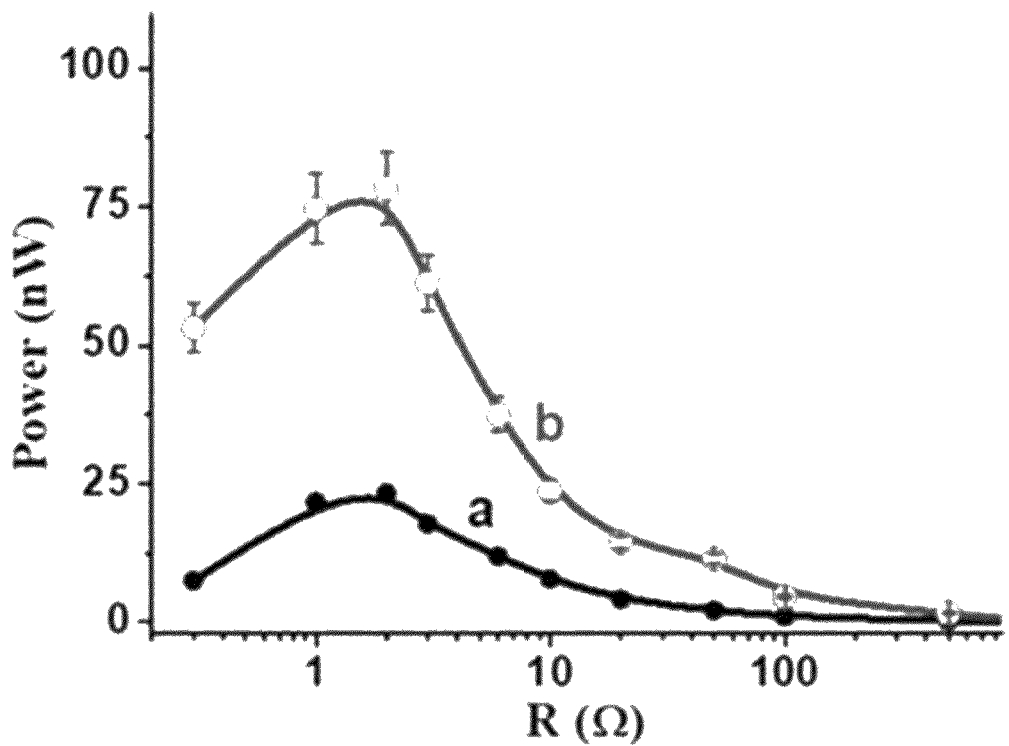
Figure 10D:
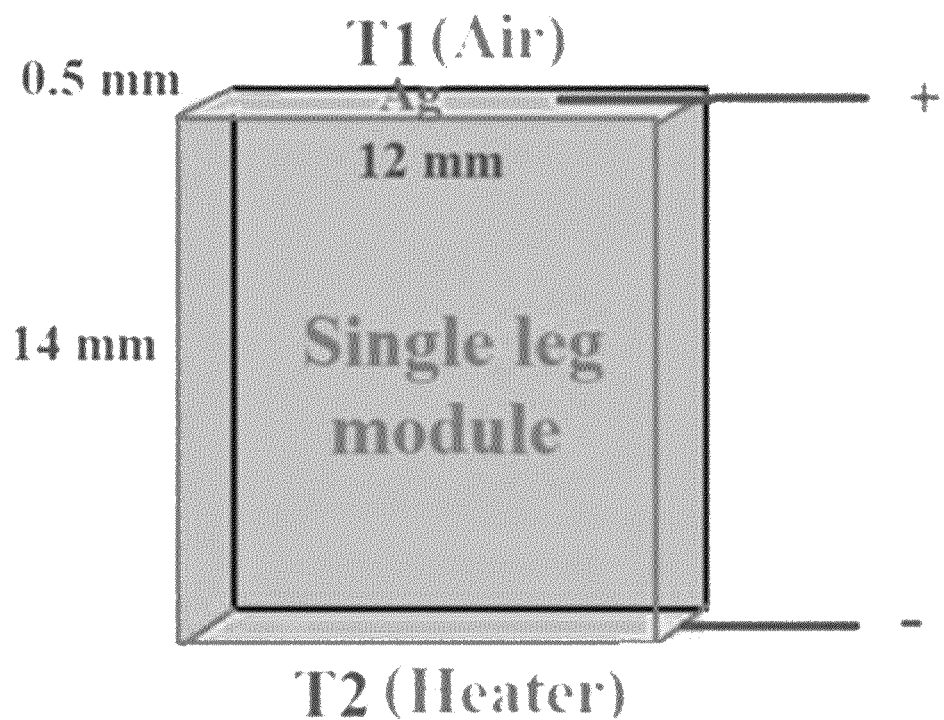
FIG. 10D shows a schematic depiction of the single leg module in a rectangular form is shown with its dimensions.
Figure 10E:
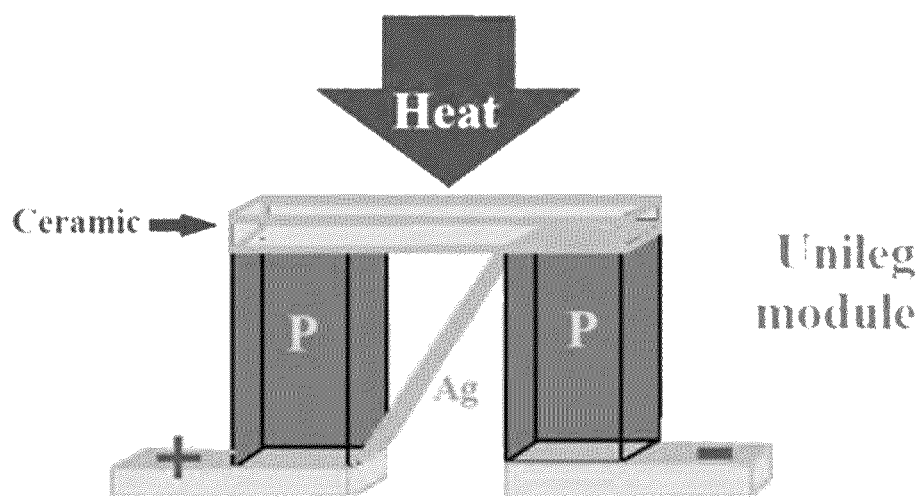
FIG. 10E shows a schematic depiction of the unileg module which has produced a power output is almost double of that generated by the single leg module (~46 nW at ΔT=20 and 155 nW at 40 K).

Thermoelectric power characteristics of a single leg module made of the BMN/SWCNT nanocomposite sheet at ΔT=20 and 40 K were measured and the obtained results are shown in FIGS. 10A-10C. This designed single leg module has a rectangular shape with dimensions of 0.5×12×14 mm as shown in FIG. 10D. This small leg could produce a measurable voltage, and current (FIG. 10A). The corresponding maximum power plotted vs the current is found to be around 24 nW at ΔT=20 K, while it reached to 80 nW at ΔT=40 K (FIG. 10B). The power output values were also plotted against the external load resistance as shown in FIG. 10C. The plotted curves show an internal resistance for this single leg equivalent to approximately 1.5Ω. A unileg module made of two legs is also designed and is shown in FIG. 10E. This module has produced a power output is almost double of that generated by the single leg module (~46 nW at ΔT=20 and 155 nW at 40 K).

Where a numerical limit or range is stated herein, the endpoints are included. Also, all values and subranges within a numerical limit or range are specifically included as if explicitly written out.

Numerous modifications and variations of the present invention are possible in light of the above teachings. It is therefore to be understood that, within the scope of the appended claims, the invention may be practiced otherwise than as specifically described herein.

The invention claimed is:

1. A thermoelectric nanocomposite sheet, comprising
porous carbonaceous particles;
electrically conductive carbon nanotubes; and
a binder, wherein
the porous carbonaceous particles comprise
  88.5 to 96.45 wt % carbon;
  1.0 to 3.0 wt % oxygen;
  2.5 to 7.5 wt % sulfur; and
  0.05 to 1.0 wt % vanadium; and
the thermoelectric nanocomposite sheet has
  a thermoelectric figure of merit ZT of 0.018 to 0.026 at 293 K and 0.016 to 0.024 at 393 K,
  a power factor of 10 to 14.0 μw/mK$^2$ at 233 K and greater than 14.0 to 18 μW/mK$^2$ at 393 K, and
  a Seebeck value of 24 to 27 μV/K at 233 K and 30 to 34 μV/K at 393 K.

2. The thermoelectric nanocomposite sheet of claim 1, wherein the thermoelectric nanocomposite sheet comprises
  80 to 95 wt % porous carbonaceous particles;
  1 to 10 wt % electrically conductive carbon nanotubes; and
  2.5 to 12.5 wt % a binder, each based on a total weight of the thermoelectric nanocomposite sheet.

3. The thermoelectric nanocomposite sheet of claim 1, wherein the porous carbonaceous particles are substantially spherical and have a mean particle size of 5 to 100 nm.

4. The thermoelectric nanocomposite sheet of claim 1, wherein the porous carbonaceous particles are substantially free of iron by EDS.

5. The thermoelectric nanocomposite sheet of claim 1, wherein the electrically conductive carbon nanotubes are single-walled carbon nanotubes.

6. The thermoelectric nanocomposite sheet of claim 1, wherein the electrically conductive carbon nanotubes have an electrical conductivity in compact pellet form of 80,000 to 95,000 S/m at 233 K and 59,000 to 76,000 S/m at 393 K.

7. The thermoelectric nanocomposite sheet of claim 1, wherein the electrically conductive carbon nanotubes have a mean diameter of 0.25 to 10 nm.

8. The thermoelectric nanocomposite sheet of claim 1, wherein the binder is polymethyl methacrylate.

9. The thermoelectric nanocomposite sheet of claim 1, having a density of 0.50 to 0.60 g/cm$^3$.

10. The thermoelectric nanocomposite sheet of claim 1, having an electrical conductivity of 18,250 to 21,000 S/m at 233 K and 16,500 to less than 18,250 S/m at 393 K.

11. The thermoelectric nanocomposite sheet of claim 1, having a thermal conductivity of 0.150 to 0.200 w/mK at 293 K and 0.300 to 0.350 W/mK at 393 K.

12. The thermoelectric nanocomposite sheet of claim 1, having a specific heat of 0.325 to 0.400 J/gK at 293 K and a specific heat of 0.395 to 0.450 J/gK at 393 K.

13. The thermoelectric nanocomposite sheet of claim 1, having a carrier density of $0.5 \times 10^{19}$ to $2.0 \times 10^{19}$ cm$^{-1}$ at 233 K and $4.0 \times 10^{19}$ to $7.5 \times 10^{19}$ cm$^{-1}$ at 393 K.

14. A method of forming the thermoelectric nanocomposite sheet of claim 1, the method comprising
dispersing the porous carbonaceous particles and the electrically conducive carbon nanotubes in a first solvent to form a carbonaceous suspension;
dissolving the binder in a second solvent to form a binder solution;
mixing the carbonaceous suspension and the binder solution at room temperature to form a mixture;
casting the mixture in a mold to form an intermediate product; and
annealing the intermediate product at 75 to 150° C. to form the thermoelectric nanocomposite sheet.

15. The method of claim 14, further comprising forming the porous carbonaceous particles by
milling oil fly ash to produce a milled ash;
treating the milled ash with an acid mixture to form a treated ash; and
drying the treated ash to form the porous carbonaceous particles.

16. The method of claim 15, wherein the milling is high-energy ball milling and is performed for 12 to 48 h.

17. The method of claim 15, wherein the acid mixture comprises sulfuric acid and nitric acid.

18. The method of claim 15, wherein the acid mixture has a mole ratio of sulfuric acid to nitric acid of 1:1 to 5:1.

19. The method of claim 14, wherein the first solvent and the second solvent are chloroform.

20. A thermoelectric device, comprising
a first electrode;
a second electrode; and
the thermoelectric nanocomposite sheet of claim 1,
wherein the first electrode and second electrode are separated by the thermoelectric nanocomposite sheet.

\* \* \* \* \*